United States Patent
Aldridge et al.

(10) Patent No.: US 10,564,309 B2
(45) Date of Patent: Feb. 18, 2020

(54) SYSTEMS AND METHODS FOR UNIQUELY IDENTIFYING BURIED UTILITIES IN A MULTI-UTILITY ENVIRONMENT

(71) Applicant: SeeScan, Inc., San Diego, CA (US)

(72) Inventors: Sequoyah Aldridge, San Diego, CA (US); Mark S. Olsson, La Jolla, CA (US); Michael J. Martin, San Diego, CA (US); Youngin Oh, San Diego, CA (US)

(73) Assignee: SEESCAN, INC., San Diego, CA (US)

( * ) Notice: Subject to any disclaimer, the term of this patent is extended or adjusted under 35 U.S.C. 154(b) by 0 days.

(21) Appl. No.: 15/626,399

(22) Filed: Jun. 19, 2017

(65) Prior Publication Data
US 2017/0363764 A1    Dec. 21, 2017

Related U.S. Application Data

(60) Provisional application No. 62/352,731, filed on Jun. 21, 2016.

(51) Int. Cl.
*G01V 3/08* (2006.01)
*G01V 3/10* (2006.01)
(Continued)

(52) U.S. Cl.
CPC ............. *G01V 3/165* (2013.01); *G01V 3/08* (2013.01); *G01V 3/104* (2013.01); *G01V 3/15* (2013.01);
(Continued)

(58) Field of Classification Search
CPC .......... G01V 3/15; G01V 3/104; G01V 3/165; G01V 3/08; G01R 33/02; G01R 33/1215; G01R 33/1223
(Continued)

(56) References Cited

U.S. PATENT DOCUMENTS

| | | | |
|---|---|---|---|
| 5,629,626 A | * | 5/1997 | Russell .............. G01V 3/08 324/226 |
| 2008/0079723 A1 | * | 4/2008 | Hanson .............. G06K 9/0063 345/427 |

(Continued)

FOREIGN PATENT DOCUMENTS

| WO | 2011/100679 A1 | 8/2011 |
|---|---|---|
| WO | 2013/141969 A2 | 9/2013 |

OTHER PUBLICATIONS

WO 2013141969, Sep. 26, 2013 (Year: 2013).*
(Continued)

*Primary Examiner* — Raul J Rios Russo
(74) *Attorney, Agent, or Firm* — Steven C. Tietsworth, Esq.

(57) ABSTRACT

The present disclosure relates to systems and methods for uniquely identifying buried utilities in a multi-utility region. The system and methods may include sensing magnetic fields upon moving a magnetic field sensing locating device over a multi-utility region comprising a plurality of buried utilities. The sensed magnetic fields may be used to identify a plurality of location data points each indicative of location information pertaining to one or more buried utilities. Based on these location data points, a plurality of clusters may be generated where each cluster may include a set of location data points sharing common characteristics. The generated clusters may exhibit one or more patterns which may be identified and subsequently utilized for classifying the clusters to uniquely identify the buried utilities.

27 Claims, 16 Drawing Sheets

US 10,564,309 B2
Page 2

(51) Int. Cl.
*G01V 3/165* (2006.01)
*G01V 3/15* (2006.01)
*G01V 3/38* (2006.01)
*G01R 33/02* (2006.01)
*G01R 33/12* (2006.01)

(52) U.S. Cl.
CPC ............... *G01V 3/38* (2013.01); *G01R 33/02* (2013.01); *G01R 33/1215* (2013.01); *G01R 33/1223* (2013.01)

(58) Field of Classification Search
USPC .......... 324/67, 323, 326, 329, 330, 334, 376
See application file for complete search history.

(56) References Cited

U.S. PATENT DOCUMENTS

| | | | | |
|---|---|---|---|---|
| 2013/0127470 A1* | 5/2013 | Olsson | | G01V 3/104 324/326 |
| 2014/0132269 A1* | 5/2014 | Olsson | | G01V 3/10 324/326 |
| 2014/0312903 A1* | 10/2014 | Olsson | | G01V 3/102 324/326 |
| 2015/0012215 A1* | 1/2015 | Young | | G01V 1/00 702/5 |
| 2015/0097568 A1* | 4/2015 | Haddy | | G01V 3/12 324/326 |
| 2015/0226872 A1* | 8/2015 | Doany | | G01V 3/38 324/329 |
| 2017/0131422 A1* | 5/2017 | Olsson | | G01V 3/081 |
| 2017/0160420 A1* | 6/2017 | Olsson | | G01V 3/12 |

OTHER PUBLICATIONS

International Searching Authority, "Written Opinion of the International Search Authority" for PCT Patent Application No. PCT/US2017/038092, dated Dec. 28, 2017, European Patent Office, Munich.

* cited by examiner

SYSTEMS AND METHODS FOR UNIQUELY IDENTIFYING BURIED UTILITIES IN A MULTI-UTILITY ENVIRONMENT

CROSS-REFERENCE TO RELATED APPLICATIONS

This application claims priority under 35 U.S.C. § 119(e) to U.S. Provisional Patent Application Ser. No. 62/352,731, entitled SYSTEMS AND METHODS FOR UNIQUELY IDENTIFYING BURIED UTILITIES IN A MULTI-UTILITY ENVIRONMENT, filed on Jun. 21, 2016, the content of which is hereby incorporated by reference herein in its entirety for all purposes.

FIELD

The present disclosure relates generally to systems and methods for locating and identifying buried utilities. More specifically, but not exclusively, the disclosure relates to systems and methods for uniquely identifying buried utilities in a multi-utility region.

BACKGROUND

Magnetic field sensing locating devices (interchangeably referred as "locating devices", "utility locators", or simply "locators") have been used for many years to locate utilities that are buried or obscured from plain sight. Such conventional locating devices are generally hand-held locators capable of sensing magnetic fields emitted from hidden or buried utilities (e.g., underground utilities such as pipes, conduits, or cables) or other conductors and processing the received signals to determine information about the conductors and the associated underground environment.

Such conventional locating devices, though useful, fail to uniquely and precisely identify buried utilities in situations where a wide variety of buried utilities are installed in close proximity to each other. Also, such conventional locating devices often detect "false" locate signals in instances where several other above-ground or underground metallic objects are installed in vicinity of the buried utilities due to interference caused by such surrounding objects. Accordingly, there is a need in the art to address the above-described as well as other problems.

SUMMARY

This disclosure relates generally to systems and methods for locating and identifying buried utilities. More specifically, but not exclusively, the disclosure relates to systems and methods for uniquely identifying buried utilities in a multi-utility region. The disclosure further relates to mapping uniquely identified buried utilities on a geographical map of the multi-utility region.

In one aspect, the present disclosure relates to a system for uniquely identifying buried utilities in a multi-utility region. The system may include a magnetic field sensing locating device including one or more antenna nodes to sense magnetic fields emitted from a plurality of buried utilities and provide antenna output signals corresponding to the sensed magnetic fields. The locating device may include a receiver circuit having a receiver input to receive the antenna node output signals, an electronic circuitry to process the received antenna node output signals, and a receiver output to provide receiver output signals corresponding to the received magnetic field signals. The locating device may further include one or more processing elements to receive and process the receiver output signals and identify a plurality of location data points indicative of location information pertaining to the buried utilities and associated characteristics. The identified location data points may be used to create a plurality of clusters each including, for example, a set of location data points sharing common characteristics. These clusters may be classified based on one or more patterns exhibited therefrom to uniquely identify each of the buried utilities.

In another aspect, the present disclosure relates to a method for uniquely identifying buried utilities in a multi-utility region. The method may include sensing magnetic fields upon moving a magnetic field sensing locating device over a multi-utility region and identifying data pertaining to the plurality of buried utilities from the sensed magnetic fields. Data may include, for example, a plurality of location data points each indicative of location information pertaining to at least one of the buried utilities, one or more timestamps associated with the location information, and one or more characteristics of the at least one of the buried utilities. Based on the identified location data points, a plurality of clusters may be generated where each cluster may include a set of location data points sharing common characteristics. The method may further include identifying one or more patterns exhibited by these clusters, and classifying, based on the one or more patterns, these clusters to uniquely identify buried utilities. Further, the location data points in the clusters may be correlated, spatially and in a time domain, for tracing the location of the uniquely identified buried utilities and mapping the traced location on a geographical map of the multi-utility region.

Various additional aspects, features, and functionality are further described below in conjunction with the appended Drawings.

BRIEF DESCRIPTION OF THE DRAWINGS

The present application may be more fully appreciated in connection with the following detailed description taken in conjunction with the accompanying drawings, wherein.

DETAILED DESCRIPTION OF EMBODIMENTS

Terminology

Figure 1A:
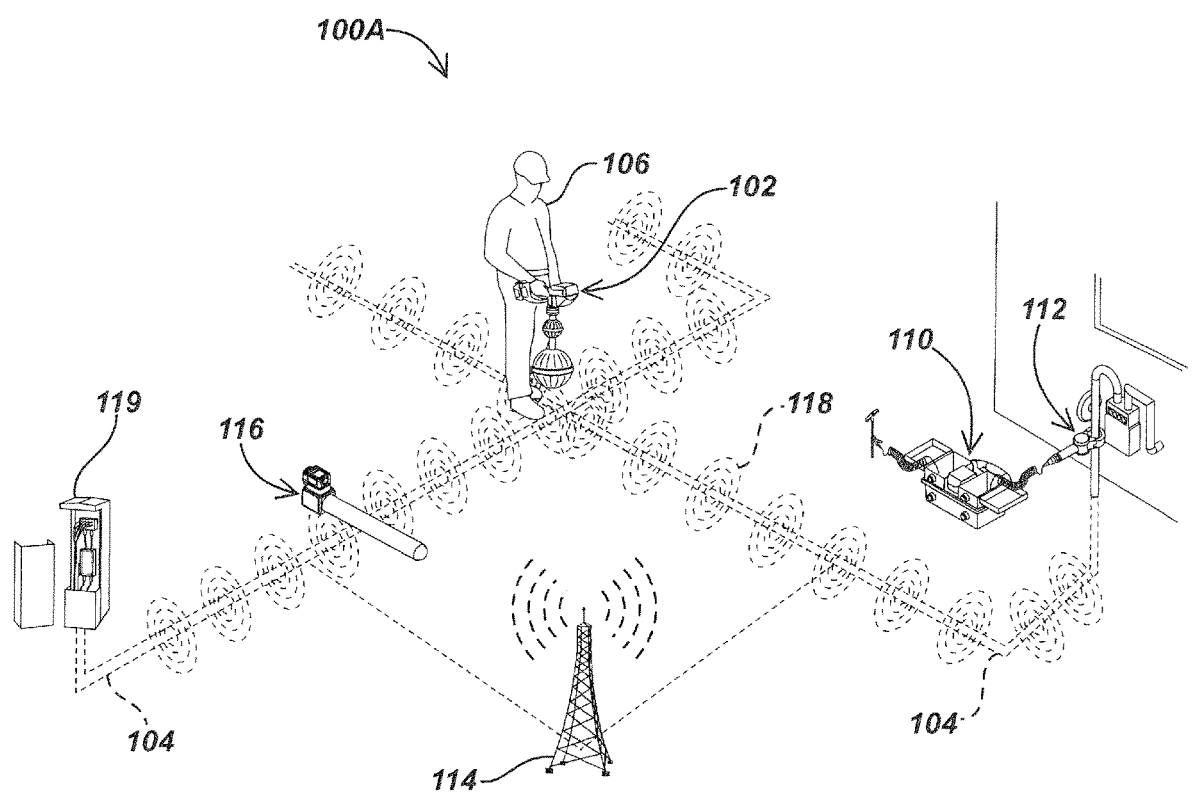
FIGS. 1A-1C illustrate an embodiment of a system for uniquely identifying buried utilities in a multi-utility region.

The term "buried utilities" as used herein refers not only to utilities below the surface of the ground, but also to utilities that are otherwise obscured, covered, or hidden from direct view or access (e.g. overhead power lines, underwater utilities, and the like). In a typical application a buried utility is a pipe, cable, conduit, wire, or other object buried under the ground surface, at a depth of from a few centimeters to meters or more, that a user, such as a utility company employee, construction company employee, homeowner or other wants to locate, map (e.g., by surface position as defined by latitude/longitude or other surface coordinates, and/or also by depth), measure, and/or provide a surface mark corresponding to it using paint, electronic marking techniques, images, video or other identification or mapping techniques.

The term "utility data" as used herein, may include, but is not limited to, data pertaining to presence or absence, position, depth, current flow, magnitude, phase, and/or direction, and/or orientation of underground utility lines. The utility data may include a plurality of location data points each indicative of location information pertaining to a buried utility (interchangeably referred to as a "buried utility line"), and associated characteristics of the buried utility. The utility data may also include timestamps associated with the location data points. Further, the utility data may include information about soil properties, other changes in properties of pipes or other conductors in time and/or space, quality metrics of measured data, and/or other aspects of the utility and broadcast signals and/or the locate environment. The utility data may also include data received from various sensors, such as motion sensors, temperature sensors, humidity sensors, light sensors, barometers, sound, gas, radiation sensors, and other sensors provided within or coupled to the locating device(s). The utility data further includes data received from ground tracking device(s) and camera element(s) provided within or coupled to the locating device(s). The utility data may be in the form of magnetic field signals radiated from the buried utility.

The term "magnetic field signals" or "magnetic fields" as used herein may refer to radiation of electromagnetic energy at the locate area. The magnetic field signals may further refer to radiation of electromagnetic energy from remote transmission sources measurable within the locate area, typically at two or more points. For example, an AM broadcast radio tower used by a commercial AM radio station may transmit a radio signal from a distance that is measurable within the locate operation area.

The terms "filter," "digital filter," or "logic filter" as used herein may refer to processing of sampled input signals utilizing mathematical algorithms to transform sampled input signals to a more desirable output. Such desirable output may include but is not limited to noise suppression, enhancement of selected frequency ranges, bandwidth limiting, estimating the value of an unknown quantity or quantities, or the like. Exemplary filters may include but are not limited to direct Fourier transforms (DFT), Kalman filters, and the like.

The term "electronic device" as used herein refers to any device or system that can be operated or controlled by electrical, optical, or other outputs from a user interface device. Examples of user electronic devices include, but are not limited to, vehicle-mounted display devices, navigation systems such as global positioning system receivers, personal computers, notebook or laptop computers, personal digital assistants (PDAs), cellular phones, computer tablet devices, electronic test or measurement equipment including processing units, and/or other similar systems or devices. In a particular embodiment of the present disclosure, the electronic device may include a map application, which is a software stored on a non-transitory tangible medium within or coupled to the electronic device configured to receive, send, generate, modify, display, store, and/or otherwise use or manipulate a map or its associated objects.

As used herein, the term "map" or "geographical map" refers to imagery, diagrams, graphical illustrations, line drawings or other representations depicting the attributes of a location, which may include maps or images containing various dimensions (i.e. two dimensional maps or images and/or three dimensional maps or images). These may be vector or raster objects and/or combinations of both. Such depictions and/or representations may be used for navigation and/or relaying information associated with positions or locations, and may also contain information associated with the positions or locations such as coordinates, information defining features, images or video depictions, and/or other related data or information. For instance, the spatial positioning of ground surface attributes may be depicted through a series of photographs or line drawings or other graphics representing a location. Various other data may be embedded or otherwise included into maps including, but not limited to, reference coordinate information such as latitude, longitude, and/or altitude data, topographical information, virtual models/objects, information regarding buried utilities or other associated objects or elements, structures on or below the surface, and the like. The maps may depict a probability contour indicative of likelihood of presence of the buried utilities at a probable location, and other associated information such as probable orientation and depth of the buried utilities. Alternatively or additionally, the map may depict optimized locations of the buried utilities along with associated information such as orientation and depth of the buried utilities.

The term "cluster" as used herein refers to sampled data that may be grouped by some property or characteristic as well as group or pattern of properties or characteristics. Such clusters may generally refer to some similarity in property or characteristic of sampled data. Such properties and characteristics may include but are not limited to measured magnetic field signals relative to orientation, azimuthal angle, depth, position, current, frequency, phase, or the like. It is also noted that the cluster analysis methods described within the present disclosure, also referred to herein as "k-means clustering" or "clustering", describe one method to determine the presence and location of utility lines. Within locating operations other like methods, such as hierarchical clustering methods or other filtering, may instead or additionally be used to locate utility lines.

The term "communicatively coupled" as used herein may refer to a link for exchange of information between locating devices, remote servers, and/or other system devices. Such a link may be transmitted via wire or cable or wirelessly, for instance, through Wi-Fi, Bluetooth, or using like wireless communication devices or protocols. Such communicative couplings may occur in real-time or near-real time or in post process. For instance, in some embodiments the locating device(s) may connect wirelessly to one or more remote servers for exchanging data in real-time or near-real time for processing and further use at the locating device(s). In other embodiments, locating data may be stored within the locating device and later transferred to a server or other computing device for processing. Such post processed data may then be downloadable by the same or other locating devices for future use. In yet further embodiments, a combination of real-time or near-real time exchange of data and storage of data for post processing may occur. For instance, some data may be exchanged in real-time or near-real time to one or more remote servers whereas other data is stored at the locating device for later transfer and post processing at a server or other computing device.

As used herein, the term, "exemplary" means "serving as an example, instance, or illustration." Any aspect, detail, function, implementation, and/or embodiment described herein as "exemplary" is not necessarily to be construed as preferred or advantageous over other aspects and/or embodiments.

Overview

The present disclosure relates generally to systems and methods for locating and identifying buried utilities. More specifically, but not exclusively, the disclosure relates to systems and methods for uniquely identifying buried utilities in a multi-utility region where a wide variety of buried utilities are installed in a close distance from each other. The disclosure further relates to mapping such uniquely identified buried utilities on a geographical map of the multi-utility region.

In one aspect, the systems and methods may include a magnetic field sensing locating device (interchangeably referred to as a "locating device") having one or more antenna nodes or antennas, a receiver circuit coupled to the antenna nodes including a receiver input, an electronic circuitry, a receiver output, and a processing unit including one or more processing elements coupled to the receiver output. The antenna nodes may sense magnetic fields emitted from the buried utilities and generate antenna output signals corresponding to the sensed magnetic fields. The antenna output signals may be received at the receiver circuit and processed to generate receiver output signals, which may be provided to the processing unit.

At the processing unit, a location identification module may process the receiver output signals to identify data pertaining to the buried utilities. The location identification module may, for example, eliminate noise or false magnetic field signals, i.e., signals that do not pertain to any of the buried utilities from the receiver output signals, to identify the data (hereinafter referred to as "utility data") that pertains to the buried utilities. The utility data may include, for example, a plurality of location data points where each data point is indicative of location information pertaining to at least one of the buried utilities in the multi-utility region.

These location data points may be received by a utility classification module at the processing unit to generate a plurality of clusters, where each cluster may include a set of location data points sharing common characteristics (e.g., substantially same depth, orientation, alignment, and the like). The generated clusters may exhibit one or more patterns (e.g., electrical characteristics including frequency spectrum, power spectrum unique to specific buried utilities) which may be subsequently identified by the utility classification module and may be utilized to classify the clusters for uniquely identifying or characterizing each of the buried utilities. The location data points in a cluster may be correlated, spatially and in a time domain, to trace location of each of the buried utilities facilitating the identified buried utilities with their corresponding traced locations to be mapped on a geographical map of the multi-utility region.

According to various aspects of the present disclosure, the systems and methods may include one or more vehicle-mounted magnetic field sensing locating devices and/or hand-carried magnetic field sensing locating devices, to uniquely identify and map buried utilities in conjunction with a remote server/system communicatively coupled to the locating devices, in real-time or during post-processing.

Details of the locating devices referred herein, additional components, methods, and configurations that may be used in conjunction with the embodiments described subsequently herein are disclosed in co-assigned patent applications including U.S. Pat. No. 7,009,399, issued Mar. 7, 2006, entitled OMNIDIRECTIONAL SONDE AND LINE LOCATOR; U.S. Pat. No. 7,136,765, issued Nov. 14, 2006, entitled A BURIED OBJECT LOCATING AND TRACING METHOD AND SYSTEM EMPLOYING PRINCIPAL COMPONENTS ANALYSIS FOR BLIND SIGNAL DETECTION; U.S. Pat. No. 7,221,136, issued May 22, 2007, entitled SONDES FOR LOCATING UNDERGROUND PIPES AND CONDUITS; U.S. Pat. No. 7,276,910, issued Oct. 2, 2007, entitled COMPACT SELF-TUNED ELECTRICAL RESONATOR FOR BURIED OBJECT LOCATOR APPLICATIONS; U.S. Pat. No. 7,288,929, issued Oct. 30, 2007, entitled INDUCTIVE CLAMP FOR APPLYING SIGNAL TO BURIED UTILITIES; U.S. Pat. No. 7,332,901, issued Feb. 19, 2008, entitled LOCATOR WITH APPARENT DEPTH INDICATION; U.S. Pat. No. 7,336,078, issued Feb. 26, 2008, entitled MULTI-SENSOR MAPPING OMNIDIRECTIONAL SONDE AND LINE LOCATORS; U.S. Pat. No. 7,557,559, issued Jul. 7, 2009, entitled COMPACT LINE ILLUMINATOR FOR LOCATING BURIED PIPES AND CABLES; U.S. Pat. No. 7,619,516, issued Nov. 17, 2009, entitled SINGLE AND MULTI-TRACE OMNIDIRECTIONAL SONDE AND LINE LOCATORS AND TRANSMITTER USED THEREWITH; U.S. Pat. No. 7,733,077, issued Jun. 8, 2010, entitled MULTI-SENSOR MAPPING OMNIDIRECTIONAL SONDE AND LINE LOCATORS AND TRANSMITTER USED THEREWITH; U.S. Pat. No. 7,741,848, issued Jun. 22, 2010, entitled ADAPTIVE MULTICHANNEL LOCATOR SYSTEM FOR MULTIPLE PROXIMITY DETECTION; U.S. Pat. No. 7,755,360, issued Jul. 13, 2010, entitled PORTABLE LOCATOR SYSTEM WITH JAMMING REDUCTION; U.S. Pat. No. 9,625,602, issued Apr. 18, 2017, entitled SMART PERSONAL COMMUNICATION DEVICES AS USER INTERFACES; U.S. Pat. No. 7,830,149, issued Nov. 9, 2010, entitled AN UNDERGROUND UTILITY LOCATOR WITH A TRANSMITTER, A PAIR OF UPWARDLY OPENING POCKETS AND HELICAL COIL TYPE ELECTRICAL CORDS; U.S. Pat. No. 7,969,151, issued Jun. 28, 2011, entitled PRE-AMPLIFIER AND MIXER CIRCUITRY FOR A LOCATOR ANTENNA; U.S. Pat. No. 8,013,610, issued Sep. 6, 2011, entitled HIGH-Q SELF TUNING LOCATING TRANSMITTER; U.S. Pat. No. 8,203,343, issued Jun. 19, 2012, entitled RECONFIGURABLE PORTABLE LOCATOR EMPLOYING MULTIPLE SENSOR ARRAY HAVING FLEXIBLE NESTED ORTHOGONAL ANTENNAS; U.S. Pat. No. 8,248,056, issued Aug. 21, 2012, entitled BURIED OBJECT LOCATOR SYSTEM EMPLOYING AUTOMATED VIRTUAL DEPTH EVENT DETECTION AND SIGNALING; U.S. Pat. No. 9,599,499, issued Mar. 21, 2017, entitled SYSTEMS AND METHODS FOR LOCATING BURIED OR HIDDEN OBJECTS USING SHEET CURRENT FLOW MODELS; U.S. Pat. No. 8,264,226, issued Sep. 11, 2012, entitled SYSTEM AND METHOD FOR LOCATING BURIED PIPES AND CABLES WITH A MAN PORTABLE LOCATOR AND A TRANSMITTER IN A MESH NETWORK; U.S. Pat. No. 9,638,824, issued May 2, 2017, entitled QUAD-GRADIENT COILS FOR USE IN LOCATING SYSTEMS; U.S. patent application Ser. No. 13/677,223, filed Nov. 14, 2012, entitled MULTI-FREQUENCY LOCATING SYSTEMS AND METHODS; U.S. patent application Ser. No. 13/769,202, filed Feb. 15, 2013, entitled SMART PAINT STICK DEVICES AND METHODS; U.S. patent application Ser. No. 13/774,351, filed Feb. 22, 2013, entitled DOCKABLE TRIPODAL CAMERA CONTROL UNIT; U.S. patent application Ser. No. 13/787,711, filed Mar. 6, 2013, entitled DUAL SENSED LOCATING SYSTEMS AND METHODS; U.S. Pat. No. 8,400,154, issued Mar. 19, 2013, entitled LOCATOR ANTENNA WITH CONDUCTIVE BOBBIN; U.S. Pat. No. 9,488,747, issued Nov. 8, 2016, entitled DUAL ANTENNA SYSTEMS WITH VARIABLE POLARIZATION; U.S. patent application Ser. No. 13/894,038, filed May 14, 2013, entitled OMNI-INDUCER TRANSMITTING DEVICES AND METHODS; U.S. patent application Ser. No. 13/958,492, filed Aug. 2, 2013, entitled OPTICAL ROUND TRACKING APPARATUS, SYSTEMS AND METHODS; U.S. Pat. No. 9,599,740, issued Mar. 21, 2017, entitled USER INTERFACES FOR UTILITY LOCATORS; U.S. patent application Ser. No. 14/027,027, filed Sep. 13, 2013, entitled SONDE DEVICES INCLUDING A SECTIONAL FERRITE CORE STRUCTURE; U.S. patent application Ser. No. 14/077,022, filed Nov. 11, 2013, entitled WEARABLE MAGNETIC FIELD UTILITY LOCATOR SYSTEM WITH SOUND FIELD GENERATION; U.S. Pat. No. 8,547,428, issued Oct. 1, 2013, entitled PIPE MAPPING SYSTEM; U.S. Pat. No. 8,635,043, issued Jan. 21, 2014, entitled Locator and Transmitter Calibration System; U.S. patent application Ser. No. 14/332,268, filed Jul. 15, 2014, entitled UTILITY LOCATOR TRANSMITTER DEVICES, SYSTEMS, AND METHODS WITH DOCKABLE APPARATUS; U.S. patent application Ser. No. 14/446,145, filed Jul. 29, 2014, entitled UTILITY LOCATING SYSTEMS WITH MOBILE BASE STATION; U.S. Pat. No. 9,632,199, issued Apr. 25, 2017, entitled INDUCTIVE CLAMP DEVICES, SYSTEMS, AND METHODS; U.S. patent application Ser. No. 14/516,558, filed Oct. 16, 2014, entitled ELECTRONIC MARKER DEVICES AND SYSTEMS; U.S. patent application Ser. No. 14/580,097, filed Dec. 22, 2014, entitled NULLED-SIGNAL LOCATING DEVICES, SYSTEMS, AND METHODS; U.S. Pat. No. 9,057,754, issued Jun. 16, 2015, entitled ECONOMICAL MAGNETIC LOCATOR APPARATUS AND METHOD; U.S. patent application Ser. No. 14/752,834, filed Jun. 27, 2015, entitled GROUND TRACKING APPARATUS, SYSTEMS, AND METHODS; U.S. patent application Ser. No. 14/797,840, filed Jul. 13, 2015, entitled GROUND-TRACKING DEVICES AND METHODS FOR USE WITH A UTILITY LOCATOR; U.S. patent application Ser. No. 14/798,177, filed Jul. 13, 2015, entitled MARKING PAINT APPLICATOR FOR USE WITH PORTABLE UTILITY LOCATOR; U.S. Pat. No. 9,081,109, issued Jul. 14, 2015, entitled GROUND-TRACKING DEVICES FOR USE WITH A MAPPING LOCATOR; U.S. Pat. No. 9,082,269, issued Jul. 14, 2015, entitled HAPTIC DIRECTIONAL FEEDBACK HANDLES FOR LOCATION DEVICES; U.S. patent application Ser. No. 14/802,791, filed Jul. 17, 2015, entitled METHODS AND SYSTEMS FOR SEAMLESS TRANSITIONING IN INTERACTIVE MAPPING SYSTEMS; U.S. Pat. No. 9,085,007, issued Jul. 21, 2015, entitled MARKING PAINT APPLICATOR FOR PORTABLE LOCATOR; U.S. patent application Ser. No. 14/949,868, filed Nov. 23, 2015, entitled BURIED OBJECT LOCATOR APPARATUS AND SYSTEMS; U.S. patent application Ser. No. 15/006,119, filed Jan. 26, 2016, entitled SELF-STANDING MULTI-LEG ATTACHMENT DEVICES FOR USE WITH UTILITY LOCATORS; U.S. Pat. No. 9,341,740, issued May 17, 2016, entitled OPTICAL GROUND TRACKING APPARATUS, SYSTEMS, AND METHODS; U.S. Provisional Patent Application 62/350,147, filed Jun. 14, 2016, entitled TRACKABLE DIPOLE DEVICES, METHODS, AND SYSTEMS FOR USE WITH MARKING PAINT STICKS; U.S. Provisional Patent Application 62/352,731, filed Jun. 21, 2016, entitled SYSTEMS AND METHODS FOR UNIQUELY IDENTIFYING BURIED UTILITIES IN A MULTI-UTILITY ENVIRONMENT; U.S. Pat. No. 9,411,067, issued Aug. 9, 2016, entitled GROUND-TRACKING SYSTEMS AND APPARATUS; U.S. patent application Ser. No. 15/247,503, filed Aug. 25, 2016, entitled LOCATING DEVICES, SYSTEMS, AND METHODS USING FREQUENCY SUITES FOR UTILITY DETECTION; U.S. patent application Ser. No. 15/250,666, filed Aug. 29, 2016, entitled PHASE-SYNCHRONIZED BURIED OBJECT TRANSMITTER AND LOCATOR METHODS AND APPARATUS; U.S. Pat. No. 9,435,907, issued Sep. 6, 2016, entitled PHASE SYNCHRONIZED BURIED OBJECT LOCATOR APPARATUS, SYSTEMS, AND METHODS; U.S. Pat. No. 9,465,129, issued Oct. 11, 2016, entitled IMAGE-BASED MAPPING LOCATING SYSTEM; U.S. patent application Ser. No. 15/331,570, filed Oct. 21, 2016, entitled KEYED CURRENT SIGNAL UTILITY LOCATING SYSTEMS AND METHODS; U.S. patent application Ser. No. 15/339,766, filed Oct. 31, 2016, entitled GRADIENT ANTENNA COILS AND ARRAYS FOR USE IN LOCATING SYSTEMS; U.S. patent application Ser. No. 15/345,421, filed Nov. 7, 2016, entitled OMNI-INDUCER TRANSMITTING DEVICES AND METHODS; U.S. patent application Ser. No. 15/360,979, filed Nov. 23, 2016, entitled UTILITY LOCATING SYSTEMS, DEVICES, AND METHODS USING RADIO BROADCAST SIGNALS; U.S. patent application Ser. No. 15/376,576, filed Dec. 12, 2016, entitled MAGNETIC SENSING BURIED OBJECT LOCATOR INCLUDING A CAMERA; U.S. Provisional Patent Application 62/435,681, filed Dec. 16, 2016, entitled SYSTEMS AND METHODS FOR ELECTRONICALLY MARKING AND LOCATING BURIED UTILITY ASSETS; U.S. Provisional Patent Application 62/438,069, filed Dec. 22, 2016, entitled SYSTEMS AND METHODS FOR ELECTRONICALLY MARKING, LOCATING, AND DISPLAYING BURIED UTILITY ASSETS; U.S. patent application Ser. No. 15/396,068, filed Dec. 30, 2016, entitled UTILITY LOCATOR TRANSMITTER APPARATUS AND METHODS; U.S. Provisional Patent Application 62/444,310, filed Jan. 9, 2017, entitled DIPOLE-TRACKED LASER DISTANCE MEASURING DEVICE; U.S. patent application Ser. No. 15/425,785, filed Feb. 6, 2017, entitled METHODS AND APPARATUS FOR HIGH-SPEED DATA TRANSFER EMPLOYING SELF-SYNCHRONIZING QUADRATURE AMPLITUDE MODULATION (QAM); U.S. patent application Ser. No. 15/434,056, filed Feb. 16, 2017, entitled BURIED UTILITY MARKER DEVICES, SYSTEMS, AND METHODS; U.S. patent application Ser. No. 15/457,149, filed Mar. 13, 2017, entitled USER INTERFACES FOR UTILITY LOCATOR; U.S. patent application Ser. No. 15/457,222, filed Mar. 13, 2017, entitled SYSTEMS AND METHODS FOR LOCATING BURIED OR HIDDEN OBJECTS USING SHEET CURRENT FLOW MODELS; U.S. patent application Ser. No. 15/457,897, filed Mar. 13, 2017, entitled UTILITY LOCATORS WITH RETRACTABLE SUPPORT STRUCTURES AND APPLICATIONS THEREOF; U.S. patent application Ser. No. 15/470,642, filed Mar. 27, 2017, entitled UTILITY LOCATING APPARATUS AND SYSTEMS USING MULTIPLE ANTENNA COILS; U.S. patent application Ser. No. 15/470,713, filed Mar. 27, 2017, entitled UTILITY LOCATORS WITH PERSONAL COMMUNICATION DEVICE USER INTERFACES; U.S. patent application Ser. No. 15/483,924, filed Apr. 10, 2017, entitled SYSTEMS AND METHODS FOR DATA TRANSFER USING SELF-SYNCHRONIZING QUADRATURE AMPLITUDE MODULATION (QAM); U.S. patent application Ser. No. 15/485,082, filed Apr. 11, 2017, entitled MAGNETIC UTILITY LOCATOR DEVICES AND METHODS; U.S. patent application Ser. No. 15/485,125, filed Apr. 11, 2017, entitled INDUCTIVE CLAMP DEVICES, SYSTEMS, AND METHODS; U.S. patent application Ser. No. 15/490,740, filed Apr. 18, 2017, entitled NULLED-SIGNAL UTILITY LOCATING DEVICES, SYSTEMS, AND METHODS; U.S. patent application Ser. No. 15/497,040, filed Apr. 25, 2017, entitled SYSTEMS AND METHODS FOR LOCATING AND/OR MAPPING BURIED UTILITIES USING VEHICLE-MOUNTED LOCATING DEVICES; and U.S. patent application Ser. No. 15/590,964, filed May 9, 2017, entitled BORING INSPECTION SYSTEMS AND METHODS. The content of each of the above-described applications is hereby incorporated by reference herein in its entirety. The above applications may be collectively denoted herein as the "co-assigned applications" or "incorporated applications."

The following exemplary embodiments are provided for the purpose of illustrating examples of various aspects, details, and functions of the present disclosure; however, the described embodiments are not intended to be in any way limiting. It will be apparent to one of ordinary skill in the art that various aspects may be implemented in other embodiments within the spirit and scope of the present disclosure.

The present disclosure relates to systems and methods for uniquely identifying buried utilities in a multi-utility region, and further relates to mapping the uniquely identified buried utilities.

In one aspect, the present disclosure relates to uniquely identifying each individual buried utility from amongst a plurality of buried utilities.

In another aspect, the present disclosure relates to uniquely and precisely identifying each buried utility in a multi-utility region where a plurality of buried utilities are present in a close proximity to each other.

In another aspect, the present disclosure relates to uniquely identifying buried utilities in a situation where one or more buried utilities cross over another buried utility or utilities.

In another aspect, the present disclosure relates to uniquely and precisely identifying buried utilities in a multi-utility region where a plurality of buried utilities are present, and additionally a plurality of other metallic/electrically conductive objects other than the utilities are present in proximity of the buried utilities.

In another aspect, the present disclosure relates to mapping the uniquely identified buried utilities on a geographical map of the multi-utility region.

In another aspect, the present disclosure relates to systems and methods for uniquely identifying buried utilities using a magnetic field sensing locating device which may be a hand-carried locating device or a vehicle-mounted locating device.

In another aspect, the present disclosure relates to systems and methods for uniquely identifying buried utilities using a plurality of magnetic field sensing locating devices including hand-carried locating devices, vehicle-mounted locating devices, or a combination of thereof.

In another aspect, the present disclosure relates to systems and methods for uniquely identifying buried utilities using one or more magnetic field sensing locating devices and a remote server communicatively coupled to such locating devices to receive data collected at the magnetic field sensing devices, to process the received data, remotely, to uniquely identify buried utilities, and to transmit information about uniquely identified buried utilities to respective user electronic devices associated with the magnetic field sensing locating devices.

In another aspect, the present disclosure relates to systems and methods for uniquely identifying buried utilities using one or more magnetic field sensing locating devices and a remote server communicatively coupled to such locating devices to receive data collected at the magnetic field sensing devices, to process the received data, remotely, to uniquely identify buried utilities, and to transmit information about uniquely identified buried utilities for remote viewing, planning, decisions and design purposes.

In another aspect, the present disclosure relates to systems and methods for uniquely identifying buried utilities utilizing one or more magnetic field sensing locating devices, or a combination of the magnetic field sensing locating devices and a remote server, to sense the magnetic fields emitted from the buried utilities, and to process the sensed magnetic fields in real-time or near-real time or in post processing to uniquely identify the buried utilities.

In another aspect, the present disclosure relates to a system for uniquely identifying buried utilities in a multi-utility region. The system may include a magnetic field sensing locating device including one or more antenna nodes to sense magnetic fields emitted from a plurality of buried utilities and provide antenna output signals corresponding to the sensed magnetic fields.

The system may further include a receiver circuit having a receiver input to receive the antenna node output signals, an electronic circuitry to process the received antenna node output signals, and a receiver output to provide receiver output signals corresponding to the received magnetic field signals.

The system may furthermore include a processing unit having one or more processing elements coupled to the receiver output to receive the receiver output signals. The processing elements may further be coupled to a location identification module to process the receiver output signals and identify utility data pertaining to the plurality of buried utilities from the receiver output signals. The utility data may include a plurality of location data points each indicative of location information pertaining to at least one of the buried utilities and its associated characteristics. The processing elements may also be coupled to a utility classification module to receive the location data points, generate a plurality of clusters, each including a set of location data points sharing common characteristics, and classify the clusters based on one or more patterns exhibited by the clusters to uniquely identify each of the buried utilities.

In another aspect, the present disclosure relates to a system for uniquely identifying and mapping buried utilities in a multi-utility region. The system may include one or more magnetic field sensing locating devices including one or more vehicle-mounted magnetic field sensing locating devices and/or hand-carried magnetic field sensing locating devices to sense magnetic field signals emitted from buried utilities. The sensed magnetic fields signals may be processed to determine utility data, for example, a plurality of location data points each indicative of location information pertaining to at least one of the buried utilities and associated characteristics of the at least one of the buried utilities. The utility data may be provided to a remote server/system communicatively coupled to the locating devices. The remote server may include a utility classification module to generate, based on the received location data points, a plurality of clusters where each cluster may include a set of location data points sharing common characteristics. The utility classification module may further identify one or more patterns exhibited by each of the generated clusters and correlate those clusters based on the patterns to uniquely identify and locate each of the buried utilities.

In another aspect, the present disclosure relates to a method for uniquely identifying buried utilities in a multi-utility region. The method may include sensing magnetic fields emitted from buried utilities upon moving a magnetic field sensing locating device over a multi-utility region and identifying them, based on the magnetic fields utility data pertaining to the buried utilities. The utility data may include a plurality of location data points where each location data point is indicative of location information pertaining to one or more buried utilities, timestamp(s) associated therewith, and one or more characteristics of such buried utilities.

The method may further include generating a plurality of clusters based on the identified location data points where each cluster may include a set of location data points sharing common characteristics. These clusters may exhibit one or more patterns which may be identified and used for classifying the clusters to uniquely identify the buried utilities. The method may also include correlating the location data points in these clusters, spatially and in a time domain, to trace location of the uniquely identified buried utilities and to map the traced location of the uniquely identified buried utilities on a geographical map of the multi-utility region.

Exemplary Embodiments

Figure 1B:
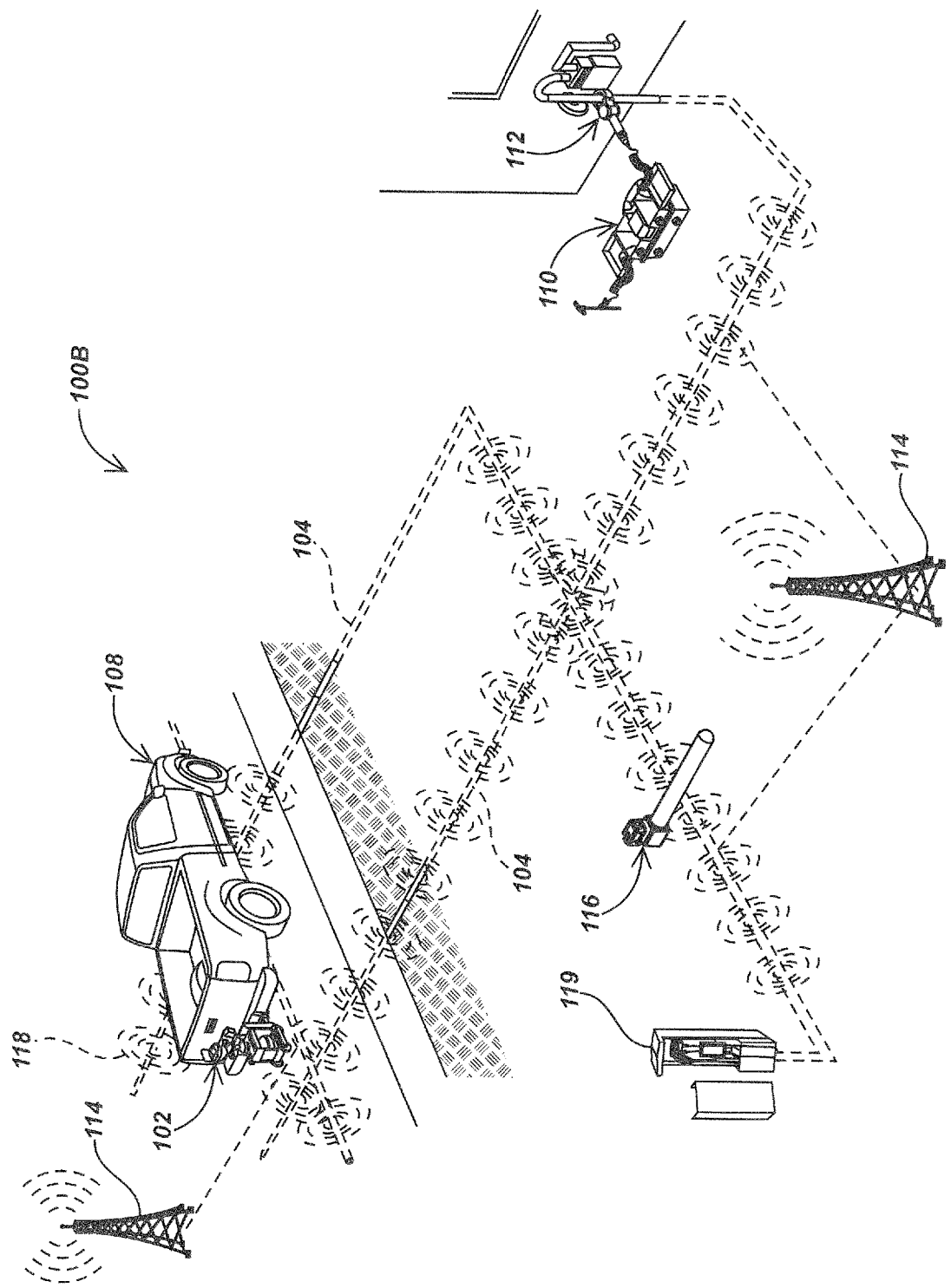

Referring to the figures now, FIGS. 1A-1B illustrate embodiments of a system 100A and 100B for uniquely identifying buried utilities in a multi-utility region, embodying the principles and concepts of the present disclosure.

The system 100A of FIG. 1A and the system 100B of FIG. 1B may include a magnetic field sensing locating device 102 (interchangeably referred to as a "locating device") to detect buried utilities 104 in a multi-utility region. The locating device 102, according to various embodiments of the present disclosure, may be a hand-carried locating device 102 carried by a technician 106 as shown in the FIG. 1A, or a vehicle-mounted locating device 102 mounted at a suitable position on a vehicle 108 as shown in the FIG. 1B.

Although embodiments of the vehicle-mounted locating device 102 described hereinafter in the description and appended drawings refer to one or more locating devices 102 being mounted on, particularly, terrestrial vehicles, this description and/or drawings are not intended to be construed in a limiting sense. The vehicle 108 may be any kind of a motor assisted user-propelled vehicle or a self-propelled vehicle capable of supporting one or more locating devices 102 thereon. Examples may include terrestrial vehicles, submarine vehicles, aerial vehicles, or a combination thereof, including, but not limited to, cars, trucks, sport utility vehicles (SUVs), motorcycles, boats, ships, low flying drones, or the like.

The system 100A and 100B of FIGS. 1A and 1B respectively may further include one or more active transmitters 110 with one or more inductive clamp devices 112 and/or direct connect clips and/or like devices for inductively or directly or capacitively coupling signal to target utility line(s) (e.g., buried utilities 104). Additionally, one or more induction stick devices 116 or like induction devices may be provided for inducing signal onto buried utilities 104. Within the system 100B of FIG. 1B, for instance, the vehicle 108 may include an inductive device (not illustrated) to induce signal onto nearby utility lines.

As illustrated in both FIGS. 1A and 1B, one or more AM radio broadcast towers 114 and/or other sources of electromagnetic signals (e.g., powerlines, transformers, or the like) may likewise generate signals that may couple to buried utilities 104 and reradiate a magnetic signal measurable at the locating device 102. For instance, the signals 118 emitted from buried utilities 104 may be active signals from the transmitter 110 and/or induction stick device 116 and/or present in the utility line (e.g., such as the electromagnetic signal inherently emitted from current flow through a powerline or line for telecommunications 119) and/or may be coupled via other electromagnetic signal transmitters (e.g., overhead powerlines, AM radio broadcast towers 114, or the like) that may be measured at the locating device 102.

Still referring to FIGS. 1A and 1B, when the locating device 102 is moved over the multi-utility region, the locating device 102 may measure magnetic fields emitted from a plurality of buried utilities 104. In general, besides buried utilities 104, the sensed magnetic fields may also include magnetic fields emitted from other buried or above ground conductors or metallic objects (hereinafter referred to as "buried objects") such as jammers, rebar in concrete, railroad spurs, ground pipe alignment, poles, and the like, buried in proximity of the buried utilities 104. The locating device 102, in accordance with the present subject matter, processes such measured magnetic fields, whereby the processing includes distinguishing the magnetic fields that pertain to the buried utilities 104 from those emitted from other buried objects based on evaluation of various parameters, including but not limited to, magnitude of the magnetic fields, gradients of the magnetic fields (e.g. gradients in a horizontal direction of the magnetic fields), and angle of elevation of the magnetic fields.

Figure 1C:
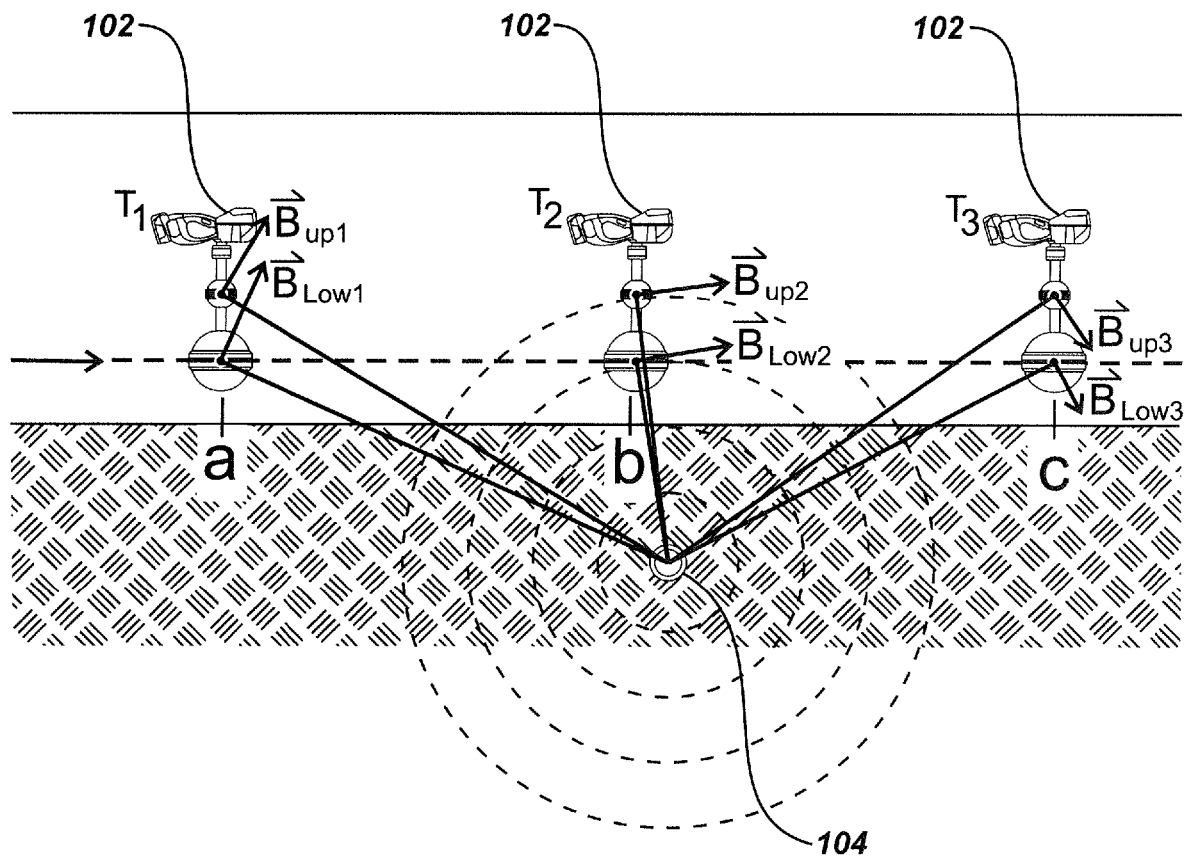

In an embodiment, such parameters are evaluated periodically or at regular intervals (in real-time, near real-time, or post processing) as the locating device 102 or the vehicle 108 having the locating device 102 attached thereto is moved along the path of the buried utilities 104. For example, as shown in the FIG. 1C, when the locating device 102 or the vehicle 108 having the locating device 102 attached thereto is moved at regular intervals, say, at intervals "a," "b," and "c", magnitude of the magnetic fields, angle of elevation of the magnetic fields and gradients may be determined at each of such intervals "a," "b," and "c". As an instance, gradients may be determined from tensor derivatives of a signal's magnetic field vector, hereinafter referred to as "gradient tensors" "T1," "T2," and "T3" based on the magnetic field vectors $(B_{Up1}, B_{Low1})$, $(B_{Up2}, B_{Low2})$, and $(B_{Up3}, B_{Low3})$, where $B_{Up1}$, $B_{Up2}$, and $B_{Up3}$ correspond to magnetic field vectors derived from the upper antenna nodes respectively, and $B_{Low1}$, $B_{Low2}$, and $B_{Low3}$ correspond to magnetic field vectors derived from the lower antenna nodes respectively.

Subsequent to evaluation of such parameters (e.g., magnitude of the magnetic fields, gradients of the magnetic fields, and angle of elevation of the magnetic fields), a determination may be made whether such parameters related to the magnetic fields are within their respective predefined range. Based on the determination, the magnetic fields having corresponding parameters in their predefined range are identified as buried utilities, and other magnetic fields are eliminated as noise. After processing, utility data pertaining to the buried utilities are identified from the magnetic fields that pertain to the buried utilities.

In some embodiments, the locating device 102 may include electronic marker excitation device(s) (not shown) provided either as an in-built device or a separate device coupled to the locating device 102, which may be actuated to excite various pre-existing electronic marks (e.g., Underground field identification/Radio Frequency Identification tags, marker devices or balls) buried in proximity to the buried utilities, in order to identify the buried utilities and utility data associated therewith.

The locating device 102 may also include imaging device(s), such as camera modules (not shown) that may detect other non-electronic pre-existing marks, such as paint marks to identify the buried utilities and associated utility data. The utility data, thus identified, as a result of processing and additionally as a result of detection of pre-existing marks may include, amongst other data, a plurality of location data points each of which indicates location information pertaining to a buried utility 104 at a geographical instance of the multi-utility region. The location information indicated by the location data point may refer to an absolute position of the buried utility 104 at the geographical instance capable of being represented in a three dimensional universal coordinate system.

Based on these location data points, the locating device 102 may generate a plurality of clusters each of which may include a set of location data points sharing common characteristics. The term "cluster" as used herein refers to sampled data that may be grouped by some property or characteristic as well as a group or pattern of properties or characteristics. The clusters may generally refer to some similarity in property or characteristic of sampled data. Examples of the characteristics may include, not in a limiting sense, underground depth, orientation, alignment, and placement relative to other objects, azimuthal of measured fields, current/power and rate of change, frequency, phase or phase change ratio, and the like.

The generated clusters may exhibit one or more patterns, which, in the context of the present subject matter, may be understood as unique characteristics associated with the buried utilities that are capable of distinguishing one buried utility from other buried utilities. Examples of the patterns may include, not in a limiting sense, electrical characteristics such as frequency spectrum and power spectrum, harmonics data (e.g., odd harmonics, even harmonics, or a combination thereof), rebroadcast frequencies, and the like. Based on such patterns, the locating device 102 may classify the clusters to uniquely identify the buried utilities 104.

In some embodiments, the locating device 102 may carry out further analysis and/or processing to determine more granular level details associated with the buried utilities. For instance, if a power line is identified as a buried utility, further analysis may indicate that the power line is a main AC power distribution line.

Figure 1D:
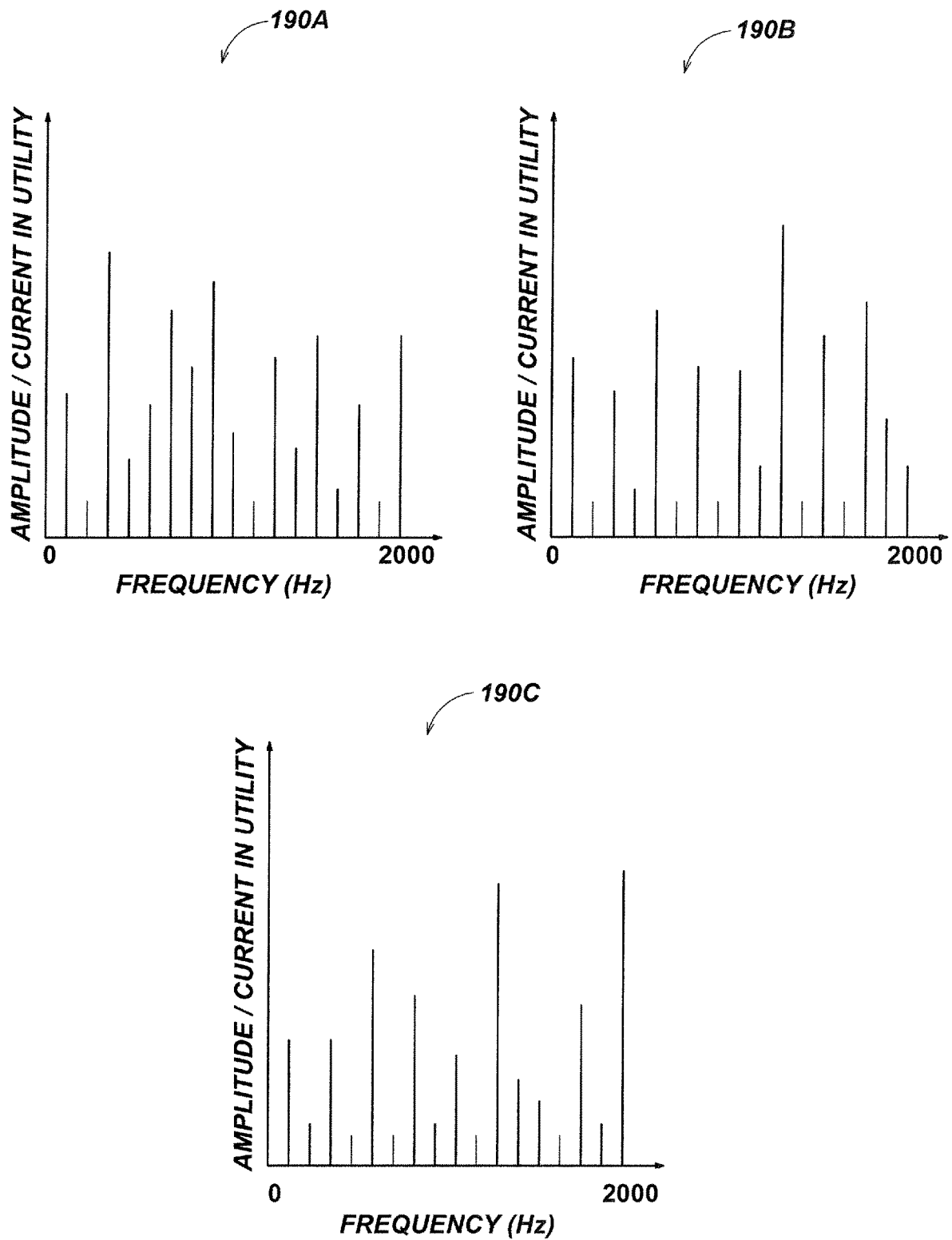
FIG. 1D illustrates exemplary power line harmonic spectra.

As further illustrated in FIG. 1D, a power line, such as the AC power distribution line previously described, may have harmonics having different power spectra, as represented graphically in power spectra 190A, 190B, and 190C. Each power line harmonic spectra 190A, 190B, and/or 190C may have a distinct fingerprint or signature. The clustering methods described herein may classify the fingerprint of the power line harmonic spectra 190A, 190B, and/or 190C allowing each associated utility line to be uniquely identified.

It is to be noted that the specific clustering method(s) described herein may be some method(s) to determine the presence and location of utility lines. However, other methods such as hierarchical clustering or other filtering methods/techniques may instead or additionally be used to locate utility lines, without deviating from the scope of the present disclosure.

Referring back to FIGS. 1A and 1B, according to one aspect, the locating device 102 may further generate an individual cluster quality metric for each of the clusters expressing how different the location data points in a cluster are from the location data points in other clusters. The locating device 102 may further generate a common cluster quality metric based on the individual cluster metrics expressing how different a cluster is from other clusters. Such a common cluster quality metric as referred herein may be understood as a metric that represents a measure of the quality of differentiation between the clusters. Alternatively or additionally, the locating device 102 may generate an individual cluster quality metric for each of the clusters expressing how similar the location data points in the cluster are with the location data points in other clusters, and may further generate a common cluster quality metric based on the individual cluster metrics expressing how similar a cluster is to other clusters. Based on one or more of such cluster quality metrics and the detected patterns, the locating device 102 may identify the clusters that are representative of a common buried utility, and process such clusters to uniquely identify each of the buried utilities.

Once the buried utilities are uniquely identified, the locating device 102 may correlate the location data points in the clusters both spatially and in a time domain, to trace the location of the identified buried utilities 104. Additionally, the locating device 102 may determine if a utility being traced has changed to a different utility to precisely trace each of the buried utilities. The identified buried utility and its traced location may be mapped on a geographical map of a multi-utility region to assist users in finding the location. The mapping may include aligning the buried utilities on a base map (e.g., pre-existing geographical map) of the multi-utility region, or vice-versa.

In some embodiments, the locating device 102 may also include a rangefinder device(s) that may be actuated to measure relative distance between various reference objects such as landmarks, curbs, sidewalks, and poles, in the vicinity of the traced location of the buried utilities 104. Such reference objects and their distance information from the buried utilities may be also be mapped onto the geographical map of the multi-utility region, to further assist the user in finding the location, or may simply be used to accurately align the buried utilities on the base map of the multi-utility region.

Embodiments of the locating device 102 and its associated components are now described with reference to the FIGS. 2A and 2B.

Figure 2A:
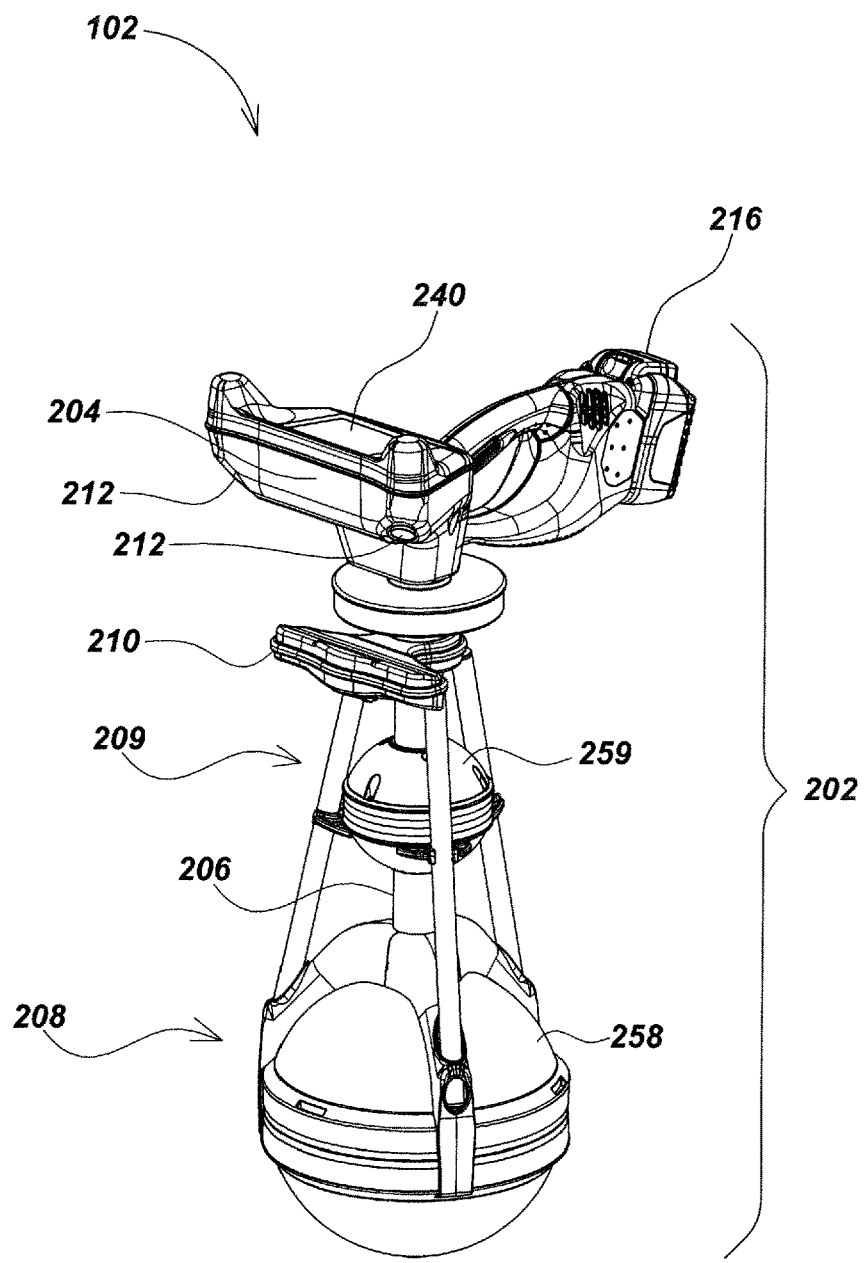
FIGS. 2A-2B illustrate an embodiment of a locating device and its associated components.

As shown in the FIG. 2A, the locating device 102 may include a body 202 which may be configured in a variety of different shapes and/or sizes. The body 202 may include a head unit 204, and a central mast 206, along with associated mechanical components, such as hardware, connectors, etc. Further, the locating device 102 may include one or more antenna nodes such as the lower antenna node 208 and the upper antenna node 209, molded to be coupled around the central mast 206, or disposed on or within the body 202 in various configurations.

Each of the antenna nodes 208 and 209 may include an antenna configuration of multiple coils. The antenna nodes 208 and 209 may each include a node housing such as node housing 258 and node housing 259, and an antenna assembly such as the dodecahedral antenna assembly 268 illustrated in FIG. 2C and the omnidirectional antenna assembly 269 also illustrated in FIG. 2C. As further illustrated in FIG. 2C, each antenna assembly 268 and 269 may be supported by an antenna array support structure 278 or 279. Alternately, or in addition, one or more of the antenna nodes may be a gradient antenna node. Likewise, in other locating device embodiments a different number of antenna nodes having different antenna assembly configurations may be used. For example, in certain embodiments, the antenna node may include one or more dodecahedral antenna node including twelve antenna coils and a gradient antenna node including two or more antenna coils.

In one embodiment, an interior omnidirectional antenna array may be provided and supported by the antenna assembly positioning a plurality of coils of an omnidirectional antenna array in orthogonal directions. The interior omnidirectional antenna array may include, for example, three orthogonally oriented antenna coils. Additionally, a gradient antenna array may be provided and supported by the antenna assembly positioning a plurality of coils of the gradient antenna array circumferentially about the omnidirectional antenna array. The gradient antenna may include, for example, two diametrically opposed pairs of gradient antenna coils. Alternatively, the gradient antenna coils may include two gradient antenna coils and two dummy coils. The two gradient antenna coils may be co-axial. In some embodiments, the two gradient antenna coils may be oriented orthogonally.

Referring again to FIG. 2A, the head unit 204 of the locating device 102 may include a receiver circuit having analog and/or digital electronic circuitry to receive and process signals from antennas and other inputs, such as audio inputs, camera signals, and the like. Head unit 204 may further include display unit 240, control and/or user interface components, such as one or more visual displays, speakers and/or headphone interfaces, switches, touchscreen elements, one or more camera elements, such as cameras 212, and the like. The camera elements may include, for example, a pair of outward cameras projecting downwardly to record imagery of the ground (locate area) where utilities are buried. A battery 216 may further connect to the locating device 102 providing electrical power thereto.

The electronic circuitry may include one or more processing units, which refers to a device or apparatus configured to carry out programmable steps and/or other functions associated with the methods described herein by processing instructions, typically in the form of coded or interpreted software instructions. For instance, a processing unit as described may be a general purpose processor, a digital signal processor (DSP), an application specific integrated circuit (ASIC), a field programmable gate array (FPGA) or other programmable logic device, discrete gate or transistor logic, discrete hardware components, memory elements, or any combination(s) thereof designed to control various locator functions, such as those described subsequently herein.

The electronic circuitry may further include a plurality of sensing units, including but not limited to, motion sensors, such as accelerometers, gyroscopes, magnetometers, altimeters, other inertial sensors, temperature sensors, humidity sensors, light sensors, barometers, sound, gas, radiation sensors, and the like. Further, the electronic circuitry may include Bluetooth radios, Wi-Fi, and/or other wireless communication devices, cameras and/or other imaging sensors, audio sensors or recorders, global positioning satellite (GPS) sensors, global navigation satellite system (GNSS), or other satellite navigation sensors incorporated therein.

The locating device 102 may also include a ground tracking device 210 coupled to the central mast 206 for tracking positions such as translational and rotational movements of the locating device 102 with respect to the ground. The ground tracking device 210 may be a stereo optical ground tracking device having one or more imagers for tracking ground features of the utility path which may be utilized to track the positions of the locating device 102. These ground features may be correlated in time to determine height of the locating device 102 from the ground surface and various other measurements. Further, the ground features may be correlated in time to calculate motion vectors facilitating precise determination of translational movements and rotations of the locating device. The determined height, translational movements and rotations, may be used to determine depth and orientation of the buried utility 104 (FIGS. 1A and 1B).

Figure 2B:
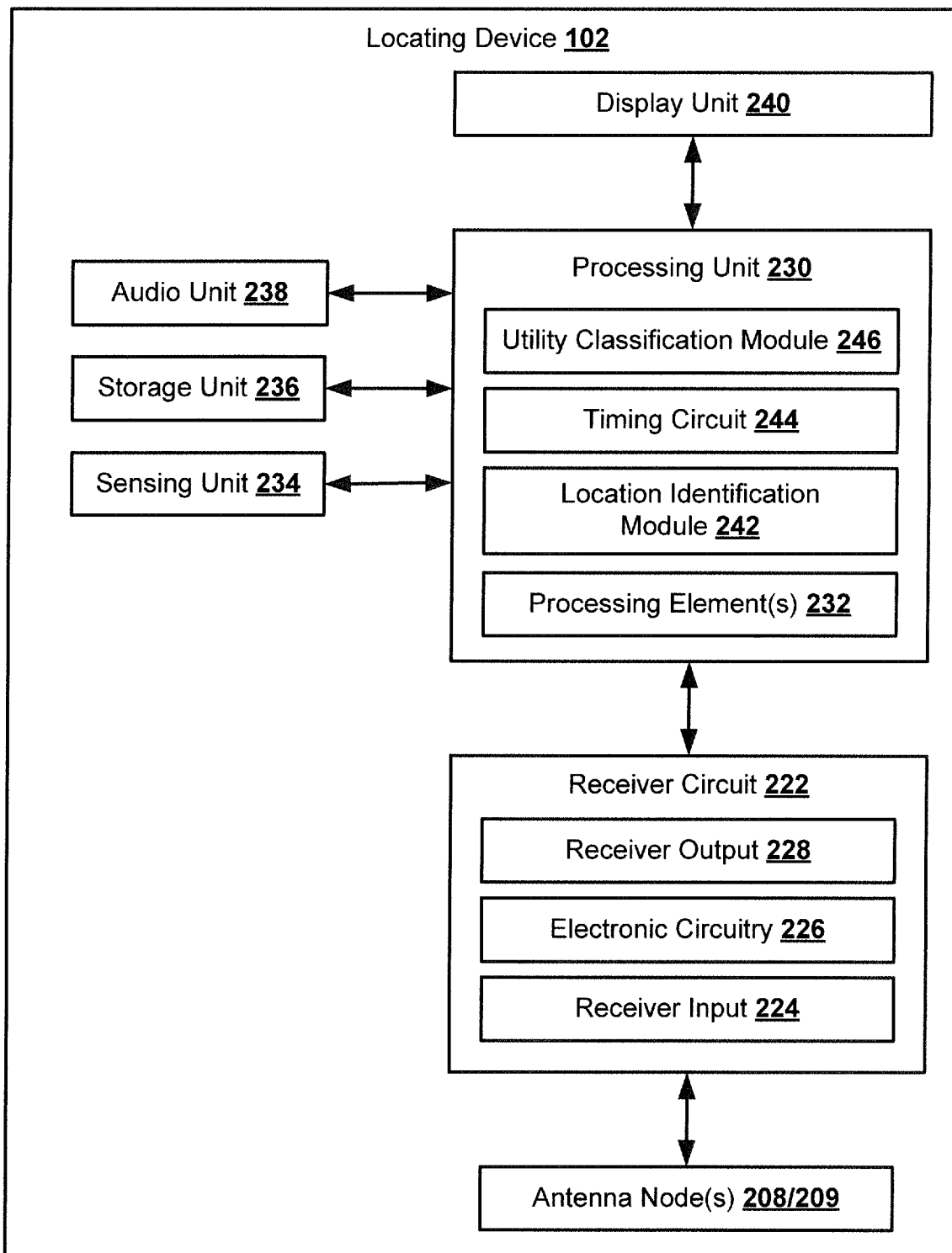
Figure 2C:
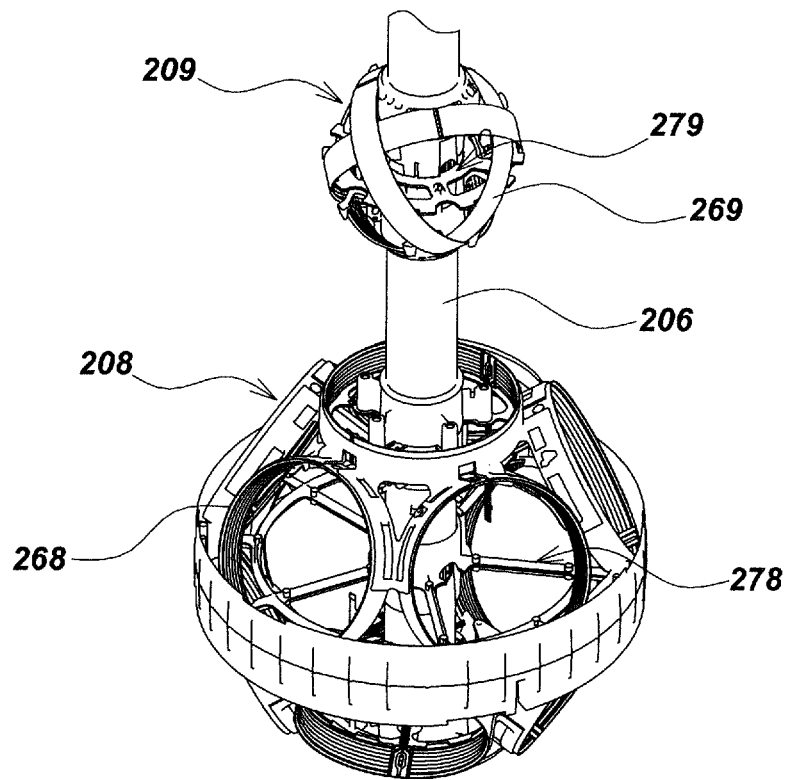
FIG. 2C illustrates exemplary antenna configurations for a locating device.

An exemplary block diagram of the locating device 102 may be seen in FIG. 2B. As shown in the FIG. 2B, the locating device 102 may include one or more antenna nodes 208 and 209 and a receiver circuit 222 coupled to the antenna nodes 208 and 209. The receiver circuit 222 may include a receiver input 224, an electronic circuitry 226, and a receiver output 228. The locating device 102 may further include a processing unit 230 coupled to the receiver circuit 222, a sensing unit 234 having a plurality of sensors coupled to the processing unit 230, a storage unit 236 that may be an internal memory or an external memory (e.g. a USB) coupled to the processing unit 230, an audio unit 238 coupled to the processing unit 230, and a display unit 240 also coupled to the processing unit 230.

The processing unit 230 may include one or more processing elements 232, such as a user interface (UI) processor (not shown) coupled to the audio unit 238 and the display unit 240, a data processor (not shown) coupled to the UI processor and the storage unit 236 (e.g. a USB), a motion processor (not shown) having sensing unit 234 coupled to the data processor, and a field-programmable gate array (FGPA, not shown) having associated digital filter(s), such as Discrete Fourier Transform (DFT) filter(s) coupled to the data processor and the antenna nodes 208 and 209. The processing unit 230 may further include a location identification module 242, a timing circuit 244, and a utility classification module 246 coupled to the processing elements 232.

According to one aspect, the antenna nodes 208 and 209 are configured to sense magnetic fields that may include active magnetic field signals directly associated with the buried utility, such as active transmitters bleed off signals, and passive magnetic field signals (e.g., broadcast signal) radiated from a radio broadcast station (e.g., AM radio station), which when encountering a portion of a buried utility, induces a current in the buried utility that generates an electromagnetic field around the buried utility, or other induced magnetic field signals induced by induction device(s), such as an induction stick (not shown). In an example, the magnetic fields may be sensed at different frequencies and/or different bandwidths. Besides buried utilities, the sensed magnetic fields may also include magnetic fields emitted from other metallic or conductive objects buried in a close proximity to the buried utilities. Upon sensing, the antenna nodes 208 and 209 provide antenna output signals, which are subsequently received by the receiver input 224 and provided to the electronic circuitry 226 for processing. After processing, the electronic circuitry 226 provides the processed signals to the receiver output 228 which may then provide the processed signals as receiver output signals to the processing unit 230. Also, the sensing units may be configured to sense various parameters associated with the movement of the locating device 102 and/or movement of the vehicle carrying the locating device 102, and provide, in response to the sensing, sensor data to the processing unit 230.

At the processing unit 230, one or more processing elements 232 may be configured to process the receiver output signals that include sensed magnetic fields and the sensor data obtained from the sensing unit 234 utilizing the location identification module 242 coupled to the processing elements 232. The processing carried out by the location identification module 242 may include distinguishing the magnetic fields that pertain to the buried utilities 104 from noise or false magnetic field signals emitted by jammers or other metallic or conductive objects buried in a close proximity to the buried utilities 104 (FIGS. 1A and 1B) based on evaluation of various parameters including, not in a limiting sense, magnitude of the magnetic fields, gradients of the magnetic fields (e.g. gradients in a horizontal direction of the magnetic fields), and angle of elevation of the magnetic fields.

Upon distinguishing the magnetic fields, the location identification module 242 may eliminate the magnetic fields emitted by general noise, self-noise or false signals emitted by other metallic or conductive objects and consider only those magnetic fields that pertain to the buried utilities 104 (FIGS. 1A and 1B) to generate or identify utility data pertaining to the buried utilities, whereby the utility data may include a plurality of location data points indicative of location information pertaining to the buried utilities at various geographical instances of the multi-utility region. The utility data may also include associated characteristics of the buried utilities 104 (FIGS. 1A and 1B) and one or more timestamps generated by the timing circuit 244 for associating with the location data points. The timestamps may include a calendar date and a time registered with a predefined degree of accuracy, say, accuracy to second, millisecond, and/or nanosecond. In one example, the timing circuit may include a clock (not shown) that is adjusted automatically based on a timing signal provided by a remote master clock operating according to a UTC (Coordinated Universal Time).

The utility data may additionally include information related to presence or absence, position, depth, current flow, magnitude, phase, and/or direction, and/or orientation of underground utility lines and/or other conductors, information about soil properties, other changes in properties of pipes or other conductors in time and/or space, quality metrics of measured data, and/or other aspects of the utility, and/or the locate environment, as well as data received from various sensing units such as motion sensors, such as accelerometers, gyroscopes, magnetometers, altimeters, and the like, temperature sensors, humidity sensors, light sensors, barometers, sound, gas, radiation sensors, and other sensors provided within or coupled to the locating device(s) 102. Also, the utility data may include data received from ground tracking device(s).

In some embodiments, subsequent to distinguishing the magnetic fields and identifying the magnetic fields that pertain to the buried utilities 104 (FIGS. 1A and 1B), further processing such as sampling of the magnetic fields that pertain to the buried utilities 104 (FIGS. 1A and 1B) may be carried out using discrete Fourier transform (DFT) filter(s). Sampling for the magnetic fields directly emitted from the buried utilities 104 may be carried out, for example, at a first predefined sampling rate (e.g., sampling rate from 5 Hz-20 Hz), and sampling for the magnetic fields radiated from a radio broadcast station such as those broadcast from AM broadcast radio tower 114, which produces the electromagnetic field around the buried utilities 104 (FIGS. 1A and 1B) may be carried out at a second predefined sampling rate (e.g., 32 Hz). Subsequent to the distinguishing and sampling, a plurality of location data points may be identified.

The identified location data points may be received and processed by the utility classification module 246 to generate a plurality of clusters of location data points, whereby each of the clusters includes a set of location data points sharing common characteristics, for example, substantially same underground depth, orientation, alignment, and placement relative to other objects, and the like. In an embodiment, the utility classification module 246 may generate clusters utilizing a conventionally known k-means clustering technique described in the book titled "*Cluster Analysis,*" *5th Edition*, ISBN: 978-0-470-97844-3, Brian S. Everitt et al., the content of which is hereby incorporated by reference herein in its entirety). However, in other embodiments, other known clustering or filtering methods/techniques may be utilized to generate the clusters.

The generated clusters may exhibit one or more patterns which are identified by the utility classification module 246 and are used to classify the clusters to uniquely identify or characterize the buried utilities 104 (FIGS. 1A and 1B). For instance, the clusters "A" and "B" both may exhibit a pattern "X," which may, for the purpose of this example, be spectral signatures that match with spectral signatures of an electricity line. Accordingly, the clusters "A" and "B" are classified as the electricity line. The patterns as referred to herein may include frequency spectrum depicting harmonics (e.g. odd harmonics and/or even harmonics) and/or rebroadcast frequencies, power spectrum, relative changes in the frequency and power spectrum, as well as phase or relative phase to other measured signals, etc. In one example, a pattern showing high relative power levels of 60 Hz and relatively low amplitudes of higher powerline harmonics is most likely a main/larger AC power distribution line. In another example, a pattern showing high relative power of 180 Hz and also potentially 540 and 900 Hz is likely to be 3 phase distribution. In another example, a pattern showing 120 Hz (single phase rectifier) and/or 360 Hz (3 phase rectifier) and low levels of AM coupling may be a cathodic protected pipe line. Also if an active multi-frequency transmitter is connected, then the power and phases of the higher frequencies will change quickly with distance away from the connection point depending on the utility type. Further, a utility that shows a lot of 120, 240, 360, 480, even harmonics may be connected to electronic equipment using rectifiers and switching power supplies. Broad band signals in the 20-60 kHz range may be traffic signal control loops.

In some embodiments, the utility classification module 246 may generate one or more cluster quality metrics, and uniquely identify each of the buried utilities based on such cluster quality metrics and/or detected patterns. Upon identification of the buried utilities, the utility classification module 246 may correlate the location data points in the clusters spatially and in a time domain to trace the location of uniquely identified buried utilities 104. Referring to the above cited example, the utility classification module 246 may correlate the location data points in the clusters "A" and "B" according to geographical locations of the location data points and associated timestamps to trace the location of the electricity line.

Figure 3A:
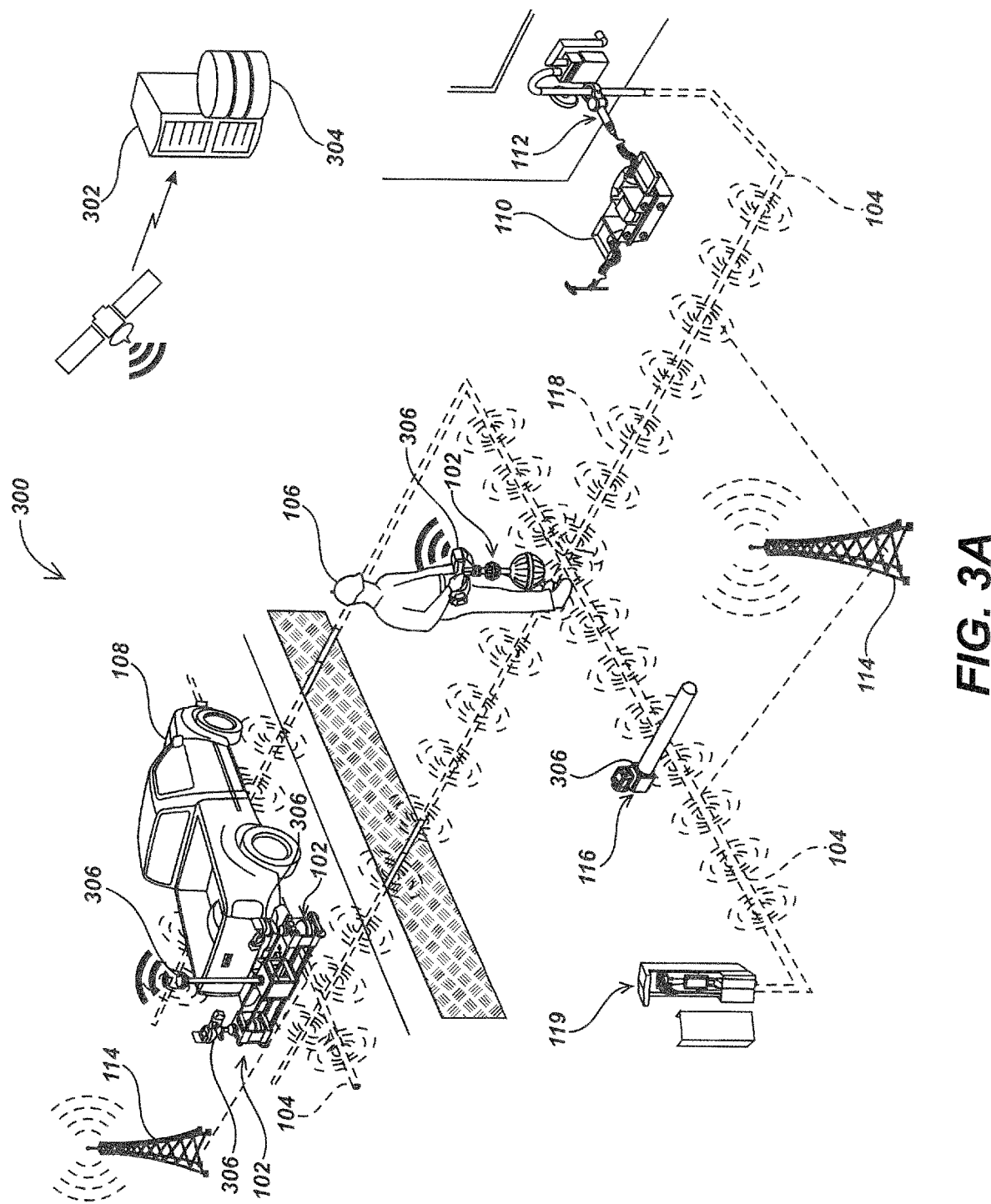
FIGS. 3A-3B illustrate an embodiment of a system for uniquely identifying buried utilities in a multi-utility region and its associated components.
Figure 3B:
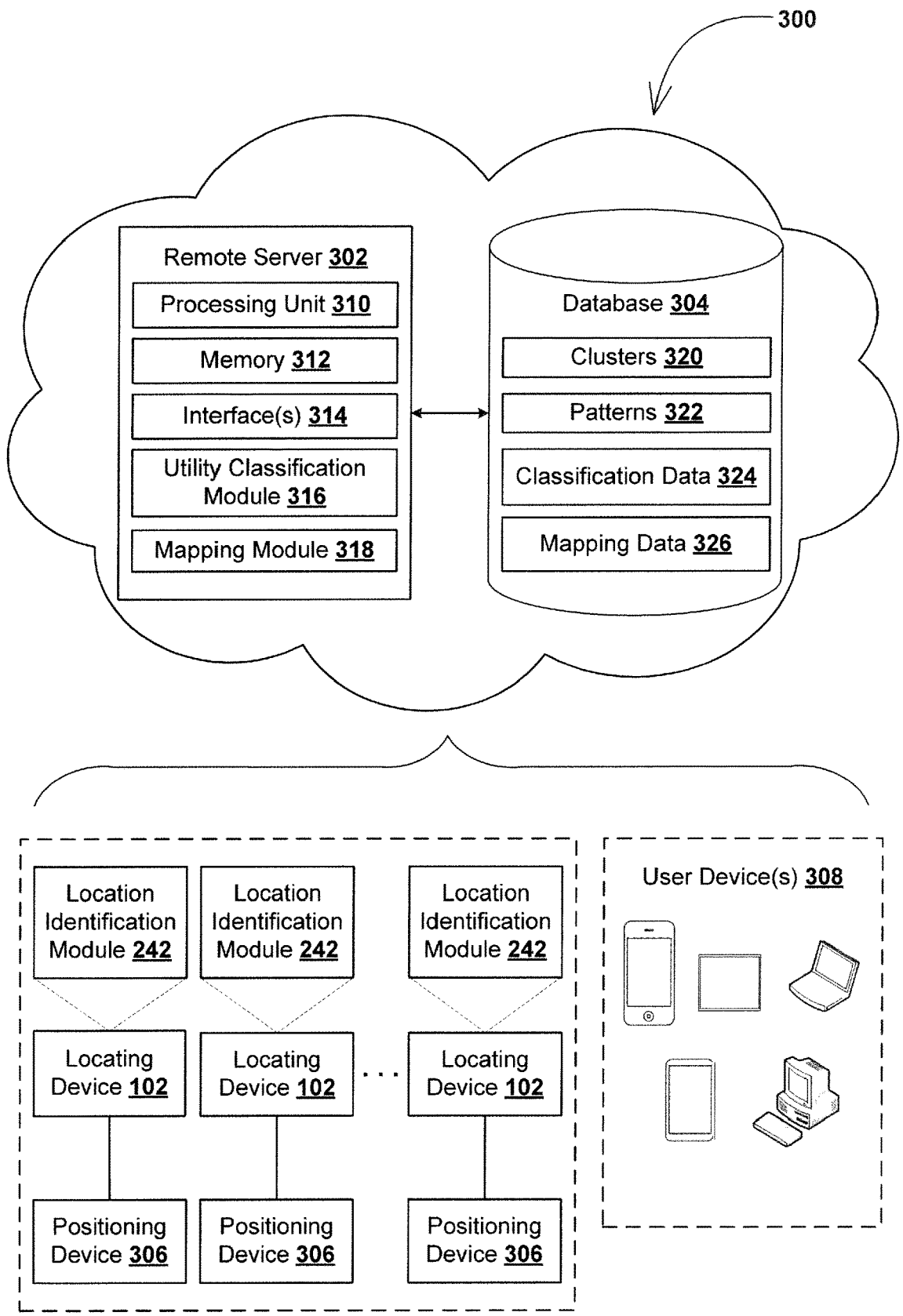

FIGS. 3A-3B illustrate embodiments of a system 300 for uniquely identifying buried utilities in a multi-utility region.

As shown in the FIG. 3A, the system 300 may include one or more locating devices 102, which may be hand-carried locating devices 102 and/or vehicle-mounted locating devices 102 communicatively coupled to a remote server/system 302 via a suitable wireless communication technology or via stored data transfer. The system 300 may further include one or more positioning devices 306 such as a high precision global position system (GPS) antennas, Global Navigation Satellite System (GNSS) antennas, or the like, operably coupled to the one or more locating devices 102. These positioning devices 306 may be attached directly to the locating devices 102 and/or may be built into the locating devices 102 in a suitable form. The system 300 may further include active transmitter(s) 110 with one or more inductive clamp devices 112 for coupling signal to a target utility line such as buried utilities 104 measurable at the locating devices 102.

Further, the system 300 may include other passive or active signal sources such as one or more AM broadcast radio towers 114, induction stick devices 116, or the like. System 300 may further include a vehicle 108 having multiple locating devices 102 for measuring magnetic field signals. One or more inductive device (not illustrated) may be mounted on the vehicle for inducing signal onto nearby utility lines. The signals 118 illustrated as emitting from buried utilities 104 may be active signals from the transmitter 110 and/or induction stick device 116 and/or present in the utility line (e.g., such as the electromagnetic signal inherently emitted from current flow through a powerline or line for telecommunications 119) and/or may be coupled via other electromagnetic signal transmission sources (e.g., overhead powerlines, AM radio broadcast towers 114, or the like) that may be measured at the locating device 102.

Turning to FIG. 3B, the remote server 302 as described above may include a database 304, which may be an internal repository implemented within the remote server 302, or an external repository associated with the remote server 302. The remote server 302 may be any electronic system/device capable of computing, such as a computer, a server, a cluster of computers or servers, cloud computing, server farm, server farms in different locations, etc. The remote server 302 may include multiple and separate components that may be electrically connected or interfaced with one another as appropriate.

In an embodiment, the remote server 302 may be implemented in a cloud environment where the remote server 302 may correspond to a cloud server operably coupled to the locating devices 102, and the database 304 may correspond to a cloud database coupled to the cloud server. The remote server 302 may be accessible to one or more electronic devices associated with the locating devices 102, a vehicle carrying the locating device 102, and/or its user/operator, via a communication link, which may include a satellite communication, or any type of network or a combination of networks. For example, network may include a local area network (LAN), a wide area network (WAN) (e.g., the Internet), a metropolitan area network (MAN), an ad hoc network, a cellular network, a radio network, or a combination of networks.

The electronic device may include a display device (e.g. a display unit 240 provided on the locating device 102 or a separate display device remotely coupled to the locating device 102), and a computing device or a wireless telecommunications device such as smart phone, personal digital assistant (PDA), wireless laptop, a notebook computer, a navigational device (e.g. a global positioning system (GPS) device), or any portable device capable of displaying and/or manipulating the maps or executing a navigation application. The electronic devices may further include vehicle mounted display devices. In one example, the remote server may include a software application hosted thereon, which is accessible by the electronic device. In another example, the remote server may provide proprietary programs or applications (apps) executable on each of the electronic devices.

As shown in the FIG. 3B, one or more locating devices 102 coupled to one or more remote servers 302 may include, amongst other components, a location identification module 242 to identify utility data from magnetic fields sensed by the locating devices 102. The utility data may include a plurality of location data points indicative of location information pertaining to the buried utilities at various geographical instances of the multi-utility region. The locating devices 102 may also include one or more positioning devices 306 associated thereto, to convert location information indicated by the location data points into an absolute position capable of being represented in a universal coordinate system (e.g., in terms of latitude and longitude). The identified location data points may be provided to the remote server 302.

The remote server 302 may include a processing unit 310, a memory 312 coupled to the processing unit 310, interface(s) 314, a utility classification module 316 coupled to the processing unit 310, and a mapping module 318 coupled to the processing unit 310. The remote server 302 may further include the database 304 configured to centrally maintain the utility data obtained from one or more locating devices 102. The database may either be an external database coupled to the remote server 302, or an internal database implemented within the memory 312 of the remote server 302.

The processing unit 310 may include a single processor, or multiple processors, all of which could include multiple computing units. The processor(s) may be implemented as one or more microprocessors, microcomputers, microcontrollers, digital signal processors, central processing units, state machines, logic circuitries, field-programmable gate arrays (FPGA), and/or any devices that manipulate signals based on operational instructions. Among other capabilities, the processor(s) is configured to fetch and execute computer-readable instructions and data stored in the memory.

The memory 312 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes.

The interface(s) 314 may include input/output interfaces and a graphical user interface enabling a user to communicate with the remote server by requesting and receiving information therefrom.

The utility classification module 316 and the mapping module 318 may be different modules that may include, amongst other things, routines, programs, objects, components, data structures, or software instructions executable by the processing unit 310 to perform particular tasks or methods of the present disclosure.

Upon receiving the utility data including location data points from the locating devices 102, the processing unit 310 within the remote server 302 may process the locating data points utilizing the utility classification module 316 coupled to the processing unit 310. As described in the foregoing, in addition to the location data points, the utility data also includes characteristics of the buried utilities associated with each of the location data points, and one or more timestamps associated with the location data points. Based on such characteristics, the utility classification module 316 may cluster the location data points into a plurality of clusters 320, whereby each of the clusters 320 includes a set of location data points sharing common characteristics.

The clusters 320 may exhibit one or more patterns 322 which may be identified by the utility classification module 316. Based on such patterns 322, the utility classification module 316 may classify the clusters 320 to uniquely identify the buried utilities 104. Data (e.g., classification data 324) obtained as a result of classification may be stored in the database 304. Further, the utility classification module 316 may correlate the location data points in the clusters 320, spatially and in a time domain based on the timestamps, to trace the location of the uniquely identified buried utilities 104. The traced location may be probable location(s) of a buried utility, or an optimized location of a buried utility. The probable location(s) may be determined, for example, based on applying a pre-configured probability estimation algorithm on the correlated location data points, and/or the optimized location may be determined, for example, based on applying a preconfigured optimization algorithm on the correlated location data points. In some embodiments, the utility classification module 316 may utilize a combination of preconfigured algorithms to first determine probable location(s) of the buried utilities and then derive an optimized location of the buried utilities therefrom.

Figure 4A:
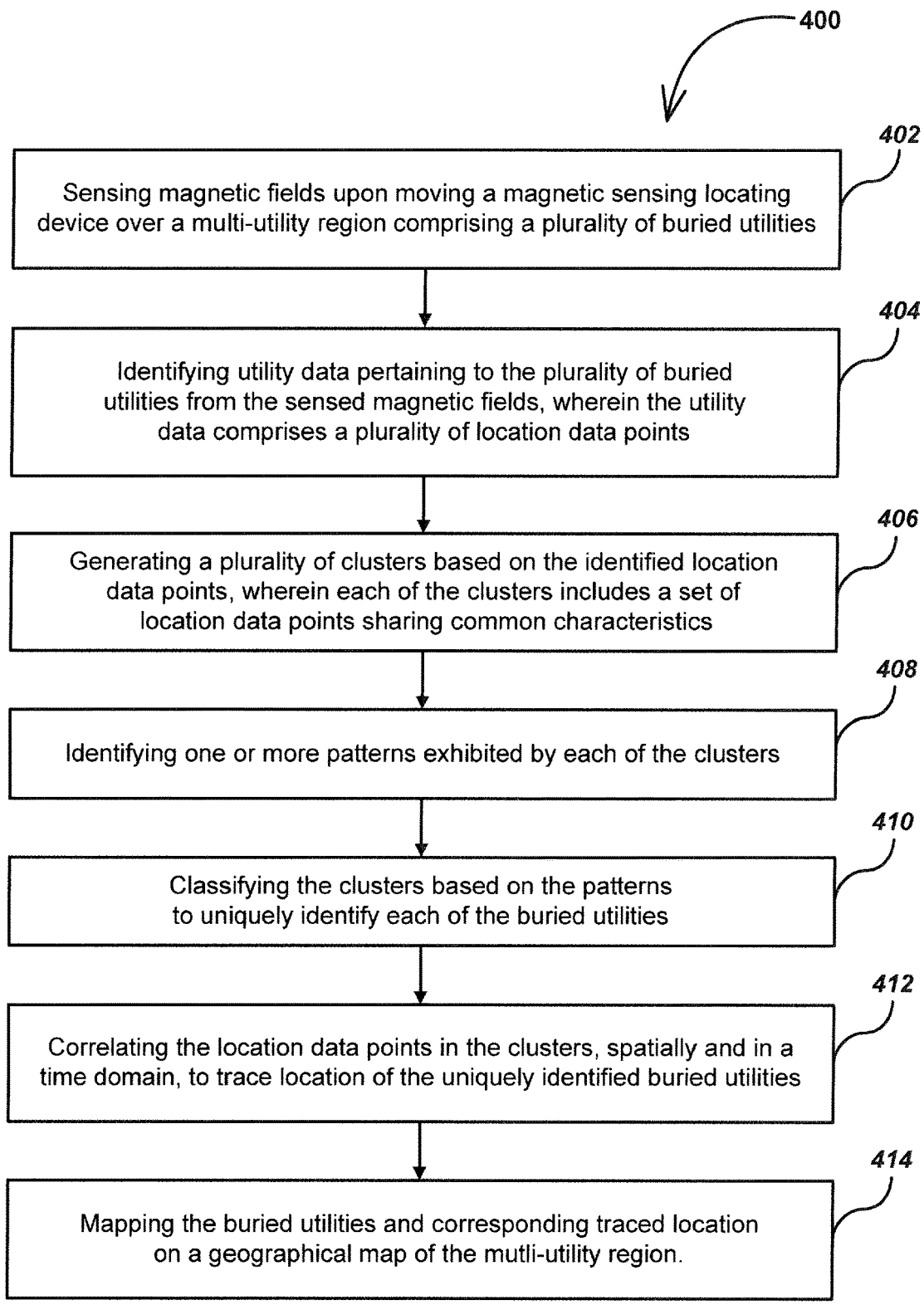
FIGS. 4A-4F illustrate an embodiment of a method for uniquely identifying buried utilities in a multi-utility region.

FIG. 4A illustrates an embodiment of a method 400 for uniquely identifying buried utilities.

Figure 4B:
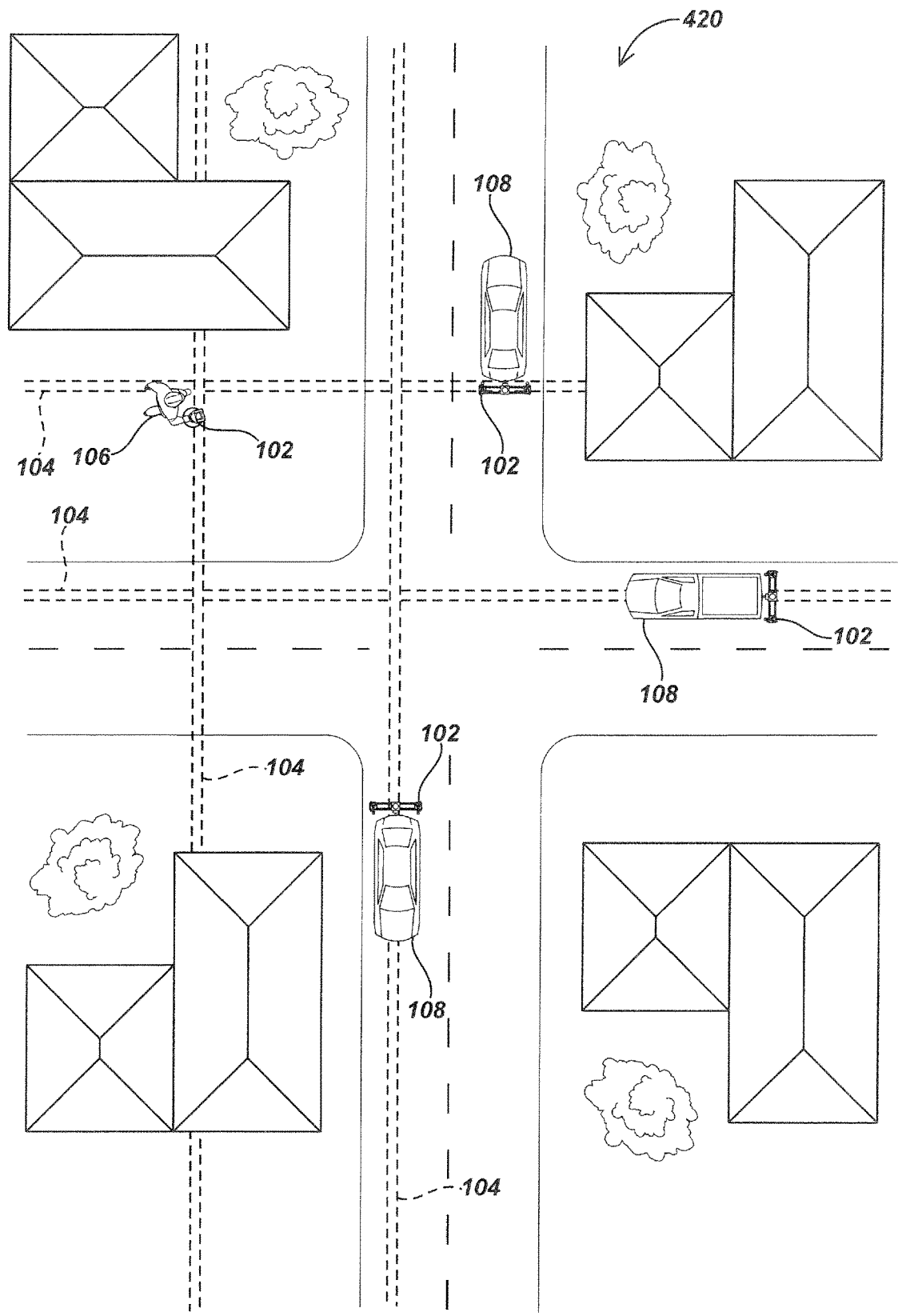

The method 400 may be initiated at block 402, where the method 400 may include sensing magnetic fields upon moving a magnetic field sensing locating device over a multi-utility region that is comprised of a plurality of buried utilities (such as the multi-utility region 420 illustrated in FIG. 4B). For example, one or more locating devices 102 (FIGS. 1A and 1B) including hand carried magnetic field sensing locating devices (FIG. 1A) and/or vehicle-mounted locating devices (locating device 102 of FIG. 1B), or a combination thereof, may be moved over the multi-utility region (such as multi-utility region 420 of FIG. 4B) to be searched to sense magnetic fields emitted therefrom. The sensed magnetic fields may include magnetic fields emitted by the buried utilities and/or those emitted by the other metallic or conductive objects buried in proximity to the buried utilities such as rebar in concrete, railroad spurs, ground pipe alignment, and the like.

At block 404, the method 400 may include identifying utility data pertaining to the plurality of buried utilities from the sensed magnetic fields, wherein the utility data comprises a plurality of location data points. The locating device(s) 102 (FIGS. 1A and 1B) may include a processing unit and associated modules, configured to process the sensed magnetic fields to identify only those magnetic fields that pertain to the buried utilities 104 (FIGS. 1A and 1B). The processing may include evaluating various parameters including, not in a limiting sense, magnitude of the magnetic fields, gradients of the magnetic fields (e.g., in a horizontal direction), and angle of elevation of the magnetic fields and determining whether such parameters related to the magnetic fields are within their respective predefined range. Based on the determination, the magnetic fields having corresponding parameters in their predefined range are identified as buried utilities, and other magnetic fields are eliminated as noise signals.

The processing may further include identifying, using a digital filter, a subset of the collected magnetic fields as a sliding window, and thereafter moving the sliding window through the magnetic fields collected at various geographical instances of the multi-utility region to test whether the magnetic fields at each of such geographical instances are outliers of the magnetic fields in the sliding window. The magnetic fields that are tested as outliers may be identified to be those that are emitted from the buried utilities, and other magnetic fields may be ignored or eliminated as noise. Subsequent to processing, utility data pertaining to the buried utilities may be identified from the magnetic fields that pertain to the buried utilities. The utility data may include a plurality of location data points indicative of location information pertaining to the buried utilities at various geographical instances of the multi-utility region.

At block 406, the method 400 may include generating a plurality of clusters based on the identified location data points, wherein each of the clusters includes a set of location data points sharing common characteristics. The locating device(s) 102 (FIGS. 1A and 1B) and/or a remote server 302 (FIGS. 3A and 3B) coupled to the locating device(s) may process the identified location data points. The processing may include clustering sets of location data points that share common characteristics into a plurality of clusters using a clustering method/technique. The clustering method, in one example, may be a k-means clustering method. The clustering may be performed in real-time or near real time. The processing may further include generating one or more cluster quality metrics used for distinguishing the clusters from each other.

At block 408, the method 400 may include identifying one or more patterns exhibited by the clusters. The locating device(s) 102 (FIGS. 1A and 1B) and/or the remote server 302 (FIGS. 3A and 3B) may identify one or more patterns exhibited by the clusters. In the context of the present disclosure, the term "patterns" may be understood as one or more unique characteristics of the buried utility capable of distinguishing the buried utility from other buried utilities. The patterns may be identified in real-time or during post processing.

At block 410, the method 400 may include classifying the clusters based on the patterns to uniquely identify each of the buried utilities. The locating device(s) 102 (FIGS. 1A and 1B) and/or the remote server 302 (FIGS. 3A and 3B) may be configured to classify the clusters based on the identified patterns to uniquely identify or characterize the buried utilities. The locating device(s) 102 (FIGS. 1A and 1B) and/or the remote server 302 (FIGS. 3A and 3B), may classify the clusters based further on the cluster quality metrics to uniquely identify each of the buried utilities. The classification may be performed in real-time or during post-processing.

At block 412, the method 400 may include correlating the location data points in the clusters, spatially and in a time domain, to trace location of the uniquely identified buried utilities. The locating device(s) 102 (FIGS. 1A and 1B) and/or the remote server 302 (FIGS. 3A and 3B) may be configured to obtain the geographical location information (e.g. latitude and longitude) and timestamps associated with the location data points, and correlate the location data points in the clusters both spatially and in a time domain to organize/arrange the location data points to trace the location of the uniquely identified buried utilities.

At block 414, the method 400 may include mapping the buried utilities and corresponding traced locations on a geographical map of the multi-utility region. The locating device(s) 102 (FIGS. 1A and 1B) and/or remote server 302 (FIGS. 3A and 3B) may be configured to map the buried utilities and their corresponding locations on the geographical map of the multi-utility region, which may be transmitted to users on their respective electronic devices. Mapping may include aligning the buried utilities on a base map (e.g. pre-existing geographical map) of the multi-utility region based on the traced location or vice-versa.

FIG. 4B illustrates an example of a multi-utility region 420, which is an intersection having a plurality of buried utilities 104 buried therein in a close distance from each other. In this example, one or more locating devices 102, such as a hand-carried locating device and/or vehicle-mounted locating device, may be moved over the multi-utility region 420 to search for the buried utilities 104. In general, the presence of a buried utility is detected by the locating device upon sensing magnetic fields from a surface of a geographical region. However, the magnetic fields sensed by the locating device 102 may not necessarily be emitted only from buried utilities. The magnetic fields may also be emitted from other metallic or conductive objects buried in proximity to the buried utilities. Therefore, the magnetic fields that are sensed by the locating device(s) 102 may include magnetic fields emitted by the buried objects and/or those emitted by the other buried objects.

According to various embodiments of the present disclosure, the locating device(s) 102 may include a processing unit and associated modules for processing the sensed magnetic fields and identifying only those magnetic fields that pertain to the buried utilities 102. The processing may include determining magnitude of the magnetic fields, evaluating gradients in a horizontal direction of the magnetic fields, measuring angle of elevation of the magnetic fields, and the like, to eliminate the noise, i.e., the magnetic fields emitted from other metallic or conductive objects that are not utilities. After processing, for example, of noise elimination (see FIG. 4C), utility data pertaining to the buried utilities may be identified. The utility data may include a plurality of location data points indicative of location information pertaining to the buried utilities at various geographical instances of the multi-utility region 420.

The locating device(s) 102 (FIGS. 1A, 1B, and 4B) and/or a remote server 302 (FIGS. 3A and 3B) coupled to the locating device(s) 102 (FIGS. 1A, 1B, and 4B) may process the identified location data points based on a clustering algorithm to generate a plurality of clusters each including a set of location data points that share common characteristics. In some embodiments, a k-means clustering algorithm may be used for clustering the location data points. The k-means clustering is a distance-based clustering algorithm partitioning a data set into a predetermined number of clusters "k." The k-means clustering algorithm finds a locally optimum way to cluster the dataset into "k" partitions so as to minimize the average difference between the mean of each cluster (cluster centroid "X") and every member of that cluster. The difference is measured by a distance metric such as Euclidean or Cosine distance metric. For example, the "Cluster 1," "Cluster 2," "Cluster 3," "Cluster 4," "Cluster 5," "Cluster 6," and "Cluster 7" are formed, as may be seen in the FIG. 4C. Such clusters may be formed as a result of execution of the k-means clustering algorithm graphic 424 depicted in FIG. 4D, wherein "K" represents the number of clusters, which is 7 in this example, and "X" represents the centroid.

Figure 4C:
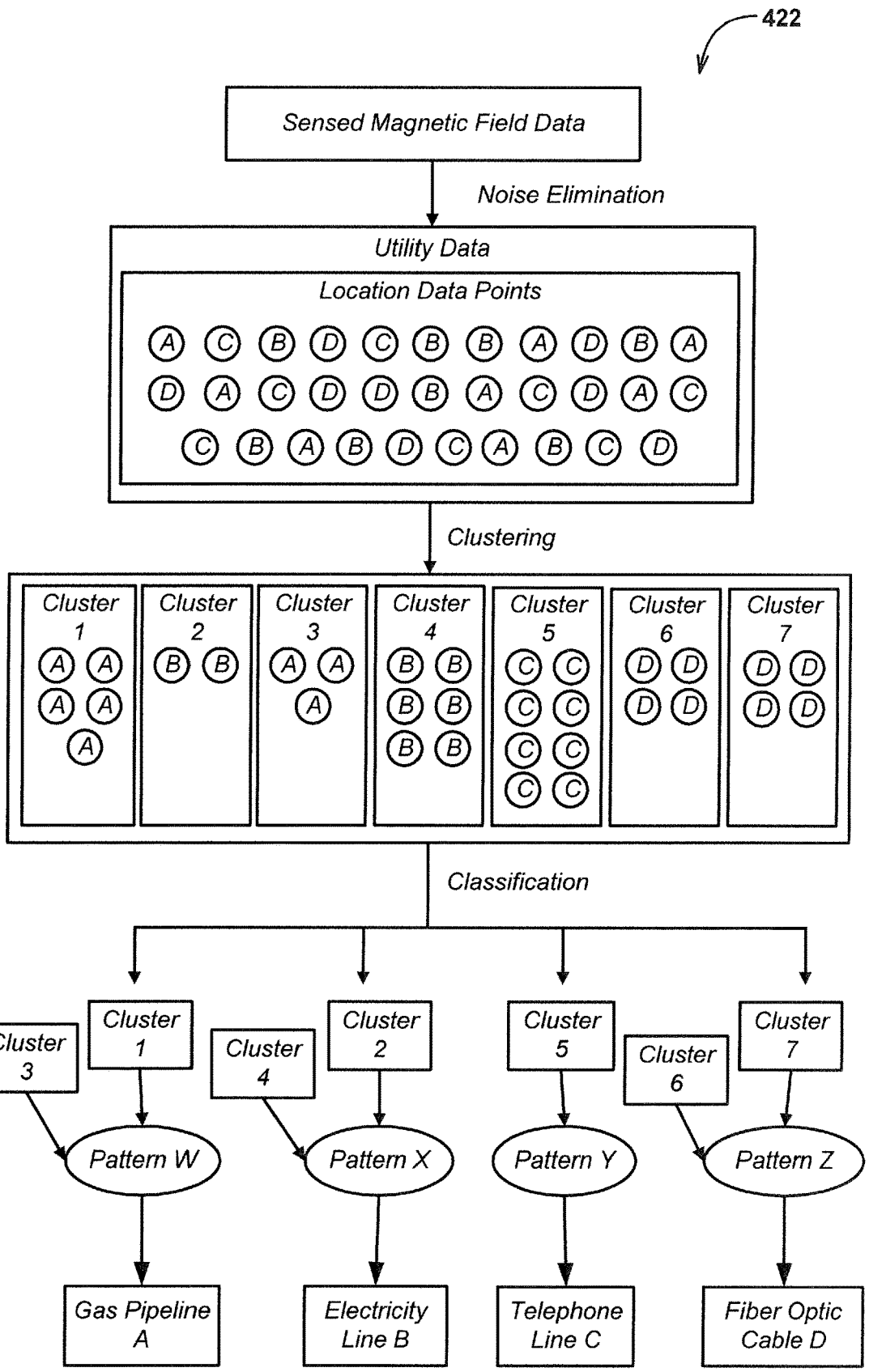
Figure 4D:
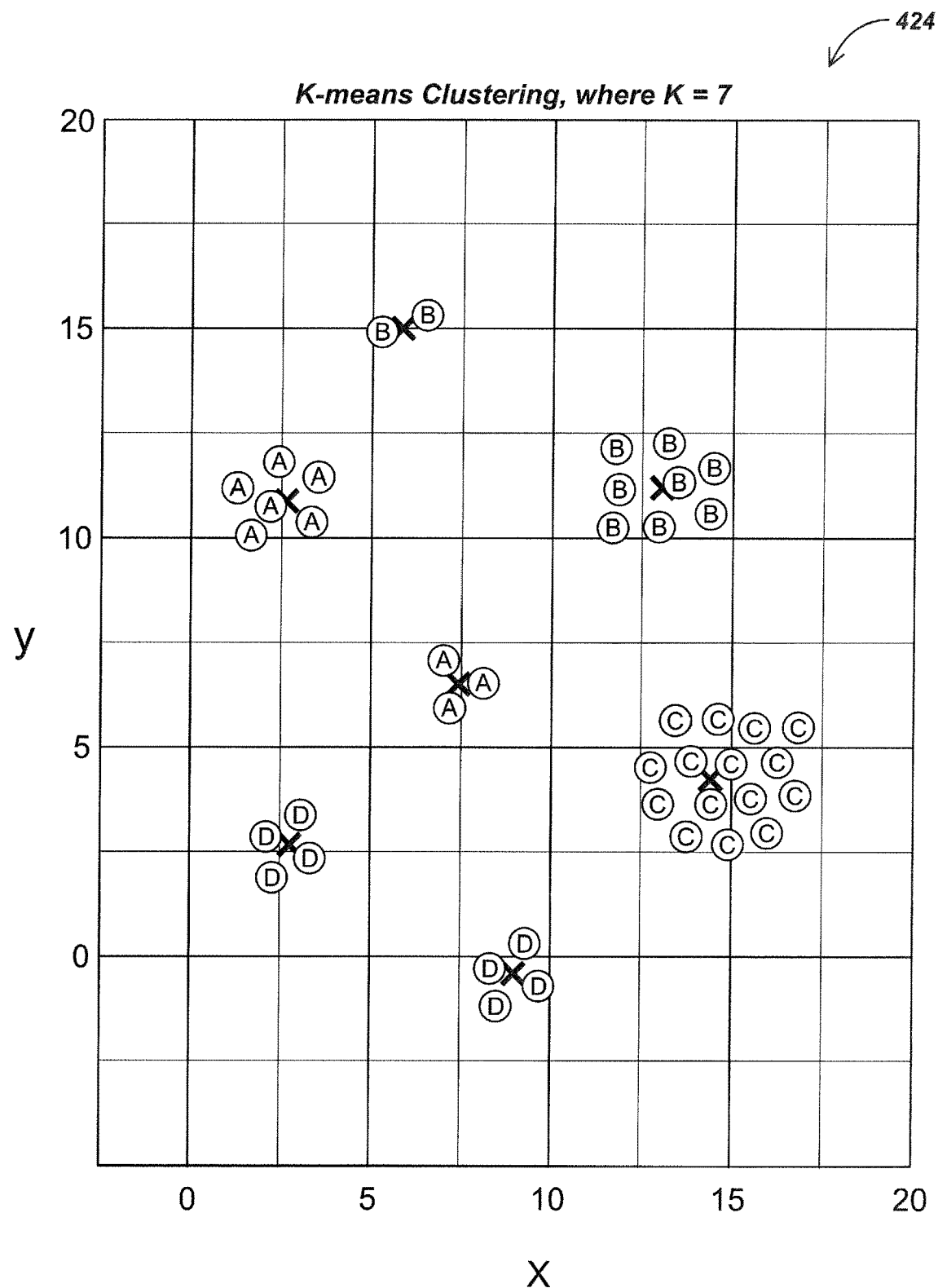

For each of the clusters, the locating device(s) 102 (FIGS. 1A, 1B, and 4B) and/or the remote server 302 (FIGS. 3A and 3B) may identify one or more patterns exhibited by such clusters. A pattern may be a unique characteristic of the buried utility line. As illustrated in FIG. 4C, the following patterns are identified: "Pattern W," "Pattern X," "Pattern Y," and "Pattern Z." Based on such patterns, the clusters may be classified. As shown, "Cluster 1" and "Cluster 3" are classified according to "Pattern W," which is indicative of a buried utility "Gas Pipeline A." Further, "Cluster 2" and "Cluster 4" are classified according to "Pattern X," which is indicative of a buried utility "Electricity Line B." Further, "Cluster 5" is classified according to "Pattern Y," which is indicative of a buried utility "Telephone Line C," and finally "Cluster 6" and "Cluster 7" are classified according to "Pattern Z," which is indicative of a buried utility "Fiber Optic Cable D."

Once each of the buried utilities is uniquely identified, the locating device(s) 102 (FIGS. 1A, 1B, and 4B) and/or the remote server 302 (FIGS. 3A and 3B) may correlate the location data points in the clusters to trace the location of the buried utilities. The location tracing may be used for mapping the uniquely identified buried utilities on a geographical map 430 (FIGS. 4E-4G) of the multi-utility region 420. The mapping may be carried out by the mapping module 318 associated with the locating device(s) and/or the remote server.

Figure 4E:
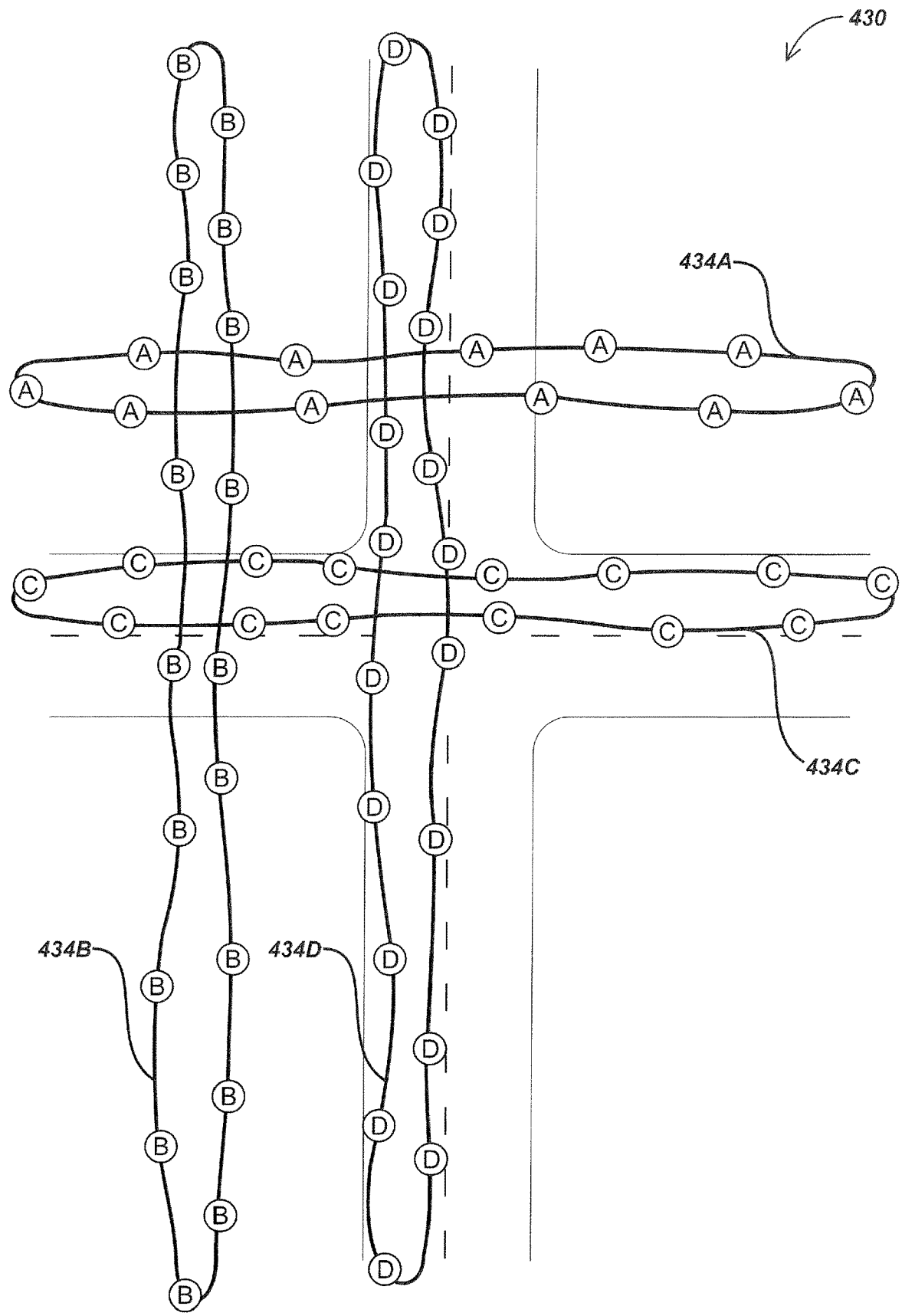
Figure 4F:
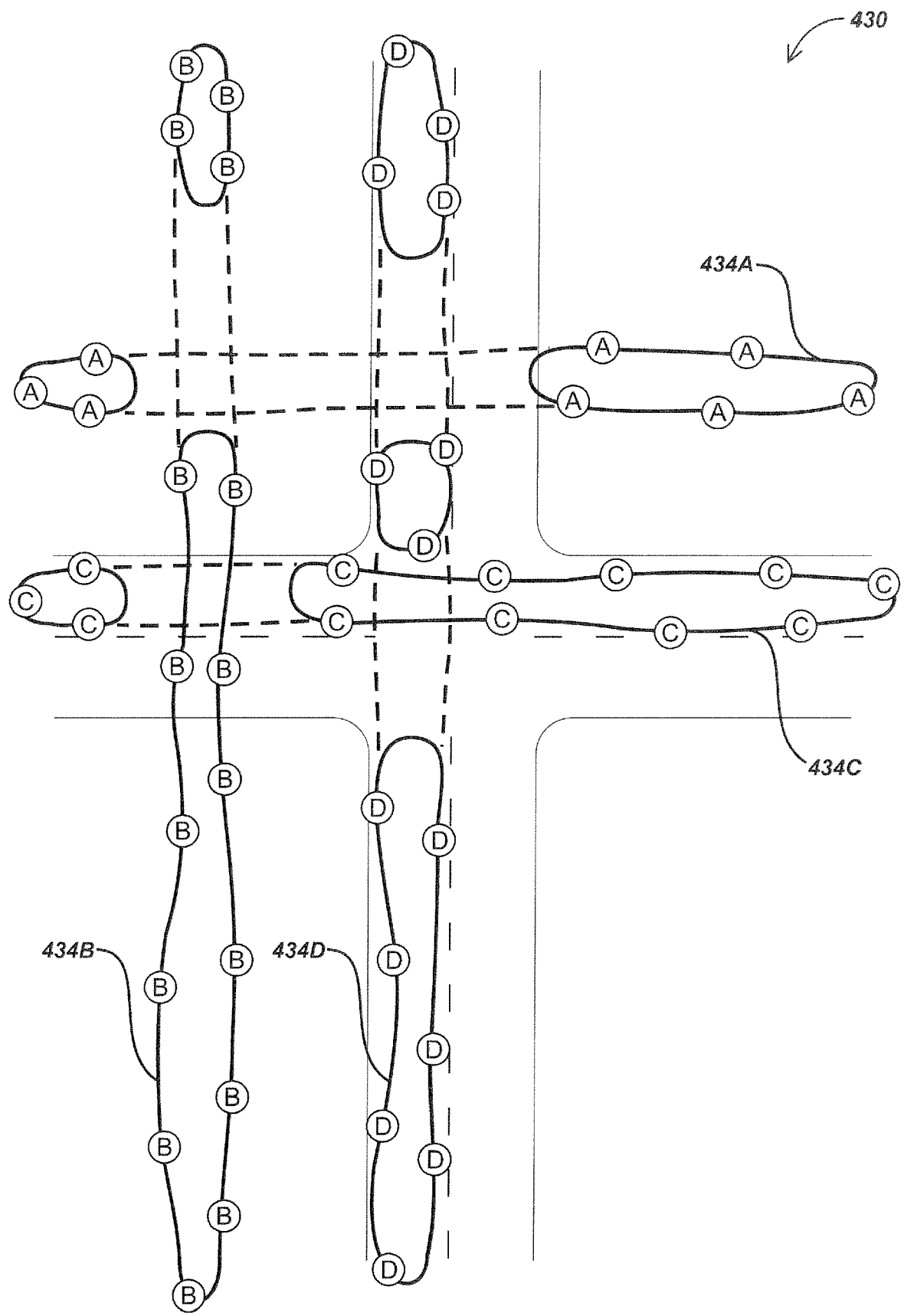
Figure 4G:
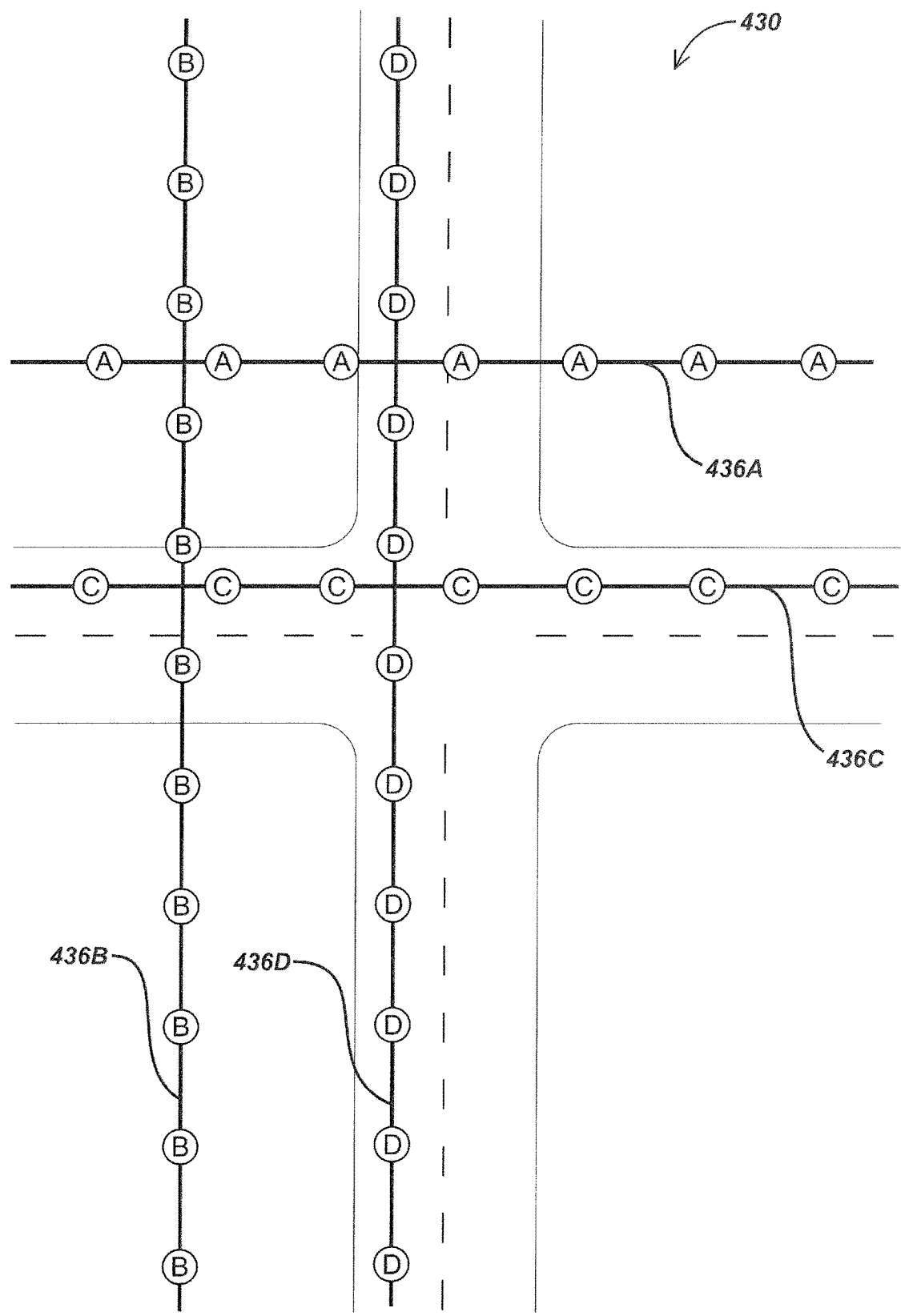
FIG. 4G illustrates an embodiment of an optimized map indicative of optimized locations of each of the buried utilities from FIGS. 4E-4F.

FIGS. 4E, 4F, and 4G illustrate exemplary geographical maps generated by the mapping module 318.

As shown in FIG. 4E, the geographical map may include probability contour(s) 434A, 434B, 434C, and/or 434D indicative of probable location(s) of the buried utilities. In an embodiment, when a particular probability contour 434A, 434B, 434C, or 434D is selected on the geographical map 430, the geographical map 430 may additionally display probability scores associated with the selected probability contour 434A, 434B, 434C, or 434D. The probability score may be in the form of a percentage, or another suitable form. As an instance, a probability score of 90% may indicate that there is 90% probability that the buried utility is within the region depicted by the probability contour.

As shown in FIG. 4F, the probability contours 434A, 434B, 434C, and/or 434D may be a combination of individual contours defined by separate clusters, which may connected (e.g., by a dotted line) on a geographical map 430 to indicate probability of the individual connected contours to be the same utility. Such probability contours may also have probability scores associated therewith.

As shown in FIG. 4G, the geographical map 430 may be an optimized map indicative of optimized locations 436A, 436B, 436C, and/or 436D of each of the buried utilities.

In some embodiments, the geographical map may be a heat map whereby a hierarchy of gradient and/or gradient tensor values may be represented by color, shading, patterns, and/or other representation of measured gradients at locations within the map. Further, the geographical map may be a user navigable map depicting the buried utility/utilities 104 (FIGS. 1A, 1B, and 4B) within the multi-utility region, and directing a user to the desired buried utilities. The geographical map may include images and/or videos of the buried location(s) to assist the user with finding the location.

In certain embodiments, the geographical map may additionally include reference data to nearby objects, such as landmarks, curbs, sidewalks, poles, and survey markers, to further assist the user in finding the location. For this purpose, one or more rangefinder devices, such as a laser rangefinder (not shown) may be provided with the locating device 102 (FIGS. 1A, 1B, and 4B) either as an in-built device or a separate device coupled to the locating device 102 (FIGS. 1A, 1B, and 4B). Such rangefinder device(s) detect one or more reference objects in the vicinity of the buried utilities, and determine, at each of the location data points, an orientation and/or placement of the locating device 102 (FIGS. 1A, 1B, and 4B) relative to the reference objects, which is stored as reference data into the locating device 102. The mapping module 318 (FIG. 3B) associated with the locating device 102 (FIGS. 1A, 1B, and 4B) may receive this reference data and subsequently map or tag the reference data with the buried utilities and their traced locations on the geographical map to further assist the users in precisely locating the buried utilities.

Further, in certain embodiments, one or more cameras or other optical sensors used as mark reader devices (not shown) may be provided with the locating device 102 (FIGS. 1A, 1B, and 4B) either as an in-built device or a separate device coupled to the locating device 102 (FIGS. 1A, 1B, and 4B), to detect/read pre-existing markers including paint marks. Likewise, the locating device 102 (FIGS. 1A, 1B, and 4B) may include a buried marker device exciter and/or buried marker device reader either as an in-built device or a separate device optionally coupled to the locating device 102 (FIGS. 1A, 1B, and 4B) to excite and detect/read buried electronic markers such as radio frequency identification/underground field identification tags or other marker devices/balls associated with buried utilities, to collect additional information pertaining to the buried utilities. Such additional information may also be mapped or tagged to corresponding buried utilities and their traced locations on the geographical map. Further, such information may allow the buried utilities to be aligned to a base map of the multi-utility region or vice versa.

The geographical map, thus generated, may be transmitted to respective one or more electronic user devices 308 (FIG. 3B) associated with the locating devices 102 (FIGS. 1A, 1B, and 4B). Alternatively, the traced location of the buried utilities 104 (FIGS. 1A, 1B, and 4B) and associated reference data and/or additional information obtained from markers may be overlaid or mapped to a pre-existing map of the multi-utility region preloaded onto the electronic user device(s) 308 (FIG. 3B). Data (e.g., mapping data 326, FIG. 3B) related to the uniquely identified buried utilities, traced location of such buried utilities, and/or the generated geographical map may be stored into the database 304 (FIG. 3B).

It is to be understood that the order in which the method 400 (FIG. 4A) is described is not intended to be construed as a limitation, and any number of the described method blocks can be combined in any order to implement the method, or alternative methods. Additionally, individual blocks may be deleted from the method without departing from the spirit and scope of the subject matter described herein.

In one or more exemplary embodiments, the functions, methods, and processes described may be implemented in whole or in part in hardware, software, firmware, or any combination thereof. If implemented in software, the functions may be stored on or encoded as one or more instructions or code on a computer-readable medium. Computer-readable media include computer storage media. Storage media may be any available media that can be accessed by a computer.

By way of example, and not limitation, such computer-readable media can include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The various illustrative functions, modules, and circuits described in connection with the embodiments disclosed herein with respect to locating and/or mapping, and/or other functions described herein may be implemented or performed in one or more processing units or modules with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The disclosures are not intended to be limited to the aspects shown herein, but are to be accorded the full scope consistent with the specification and drawings, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c.

The previous description of the disclosed aspects is provided to enable any person skilled in the art to make or use embodiments of the present invention. Various modifications to these aspects will be readily apparent to those skilled in the art, and the generic principles defined herein may be applied to other aspects without departing from the spirit or scope of the disclosure and invention. Thus, the invention is not intended to be limited to the aspects shown herein but is to be accorded the widest scope consistent with the disclosures and associated drawings and their equivalents.

We claim:

1. A method for uniquely identifying buried utilities in a multiutility region, the method comprising:
   Sensing, with a locator having two or more antenna nodes each including nested orthogonal antenna coils, AC (alternating current) magnetic fields upon moving the locating device over a multi-utility region comprising a plurality of buried utilities, wherein the AC magnetic fields are generated from currents flowing in the utilities:
   identifying utility data pertaining to the plurality of buried utilities from the sensed magnetic fields, wherein the utility data comprises a plurality of location data points each indicative of location information pertaining to at least one of the buried utilities and one or more characteristics of the at least one of the buried utilities;

generating a plurality of clusters based on the identified location data points, wherein each of the clusters includes a set of location data points sharing common characteristics; identifying one or more patterns exhibited by each of the plurality of clusters; and classifying the clusters, based on the one or more patterns, to uniquely identify the buried utilities.

2. The method of claim 1, further comprising correlating the location data points in the clusters, spatially and in a time domain, based at least on timestamps associated with the location data points, to trace location of the uniquely identified buried utilities.

3. The method of claim 2, further comprising mapping the traced location of the uniquely identified buried utilities on a geographical map of the multi-utility region.

4. The method of claim 1, wherein the generating comprises applying a k-means clustering algorithm on the identified location data points to generate the plurality of clusters.

5. The method of claim 1, wherein the sensed magnetic fields include magnetic fields emitted from the plurality of buried utilities and from one or more buried objects other than the buried utilities.

6. The method of claim 5, wherein identifying the utility data comprises distinguishing the magnetic fields emitted from the plurality of buried utilities from magnetic fields emitted from the one or more buried objects based on at least one of a magnitude of the magnetic fields, gradients in a horizontal direction of the magnetic fields, and an angle of elevation of the magnetic fields.

7. The method of claim 1, further comprising generating a cluster quality metric for the plurality of clusters, and utilizing the cluster quality metric and the one or more patterns to uniquely identify each of the buried utilities.

8. The method of claim 1, further comprising sampling the sensed magnetic fields at a predefined sampling rate.

9. The method of claim 1, wherein the common characteristics include one or more of substantially same underground depth, orientation, alignment, and placement relative to other objects.

10. The method of claim 1, wherein the patterns include one or more of a frequency spectrum, a power spectrum, a harmonics pattern, a rebroadcast frequencies pattern, and a spectral signature.

11. A system for uniquely identifying buried utilities in a multiutility region, the system comprising:
two or more antenna nodes each including two or more nested orthogonal antenna coils for sensing AC (alternating current) magnetic fields emitted from a plurality of buried utilities and provide antenna output signals corresponding to the sensed magnetic fields;
a receiver circuit having a receiver input to receive the antenna node output signals, an electronic circuitry to process the received antenna node output signals, and a receiver output to provide receiver output signals corresponding to the received magnetic field signals; and
a processing unit, including one or more processing elements, coupled to the receiver output to receive the receiver output signals, and further coupled to:
a location identification module to process the receiver output signals and identify utility data pertaining to the plurality of buried utilities from the receiver output signals, wherein the utility data comprises a plurality of location data points each indicative of location information pertaining to at least one of the buried utilities and associated characteristics of the at least one of the buried utilities; and
a utility classification module to receive the location data points, generate a plurality of clusters each including a set of location data points sharing common characteristics, and classify the clusters, based on one or more patterns exhibited by the clusters, to uniquely identify each of the buried utilities.

12. The system of claim 11, wherein the location data points are associated with timestamps based on which the location data points in the clusters are correlated with each other to trace location of the uniquely identified buried utilities.

13. The system of claim 12, wherein the traced location is one of an optimized location of each of the buried utilities and one or more probable locations of each of the buried utilities.

14. The system of claim 12, wherein each of the uniquely identified buried utility and corresponding traced location is mapped on a geographical map of the multi-utility region for display on a user electronic device coupled to the magnetic field sensing locating device.

15. The system of claim 11, wherein the clusters are generated based on a k-means clustering algorithm.

16. The system of claim 11, wherein the utility classification module is configured to generate a cluster quality metric indicative of quality of differentiation between the clusters, and classify the clusters based on the cluster quality metric and the one or more patterns to uniquely identify each of the buried utilities.

17. The system of claim 11, wherein the common characteristics include one or more of substantially same underground depth, orientation, alignment, and placement relative to other objects.

18. The system of claim 11, wherein the patterns include one or more of a frequency spectrum, a power spectrum, a harmonics pattern, a rebroadcast frequencies pattern, and a spectral signature.

19. The system of claim 11, wherein the sensed magnetic fields include magnetic fields emitted from the plurality of buried utilities and from one or more buried objects other than the buried utilities.

20. The system of claim 19, wherein the location identification module is configured to distinguish the magnetic fields emitted from the plurality of buried utilities from magnetic fields emitted from the one or more buried objects based on at least one of a magnitude of the magnetic fields, gradients in a horizontal direction of the magnetic fields, and angle of elevation of the magnetic fields, and eliminate the magnetic fields emitted from the one or more buried objects to identify the utility data pertaining to the buried utilities.

21. The system of claim 11, wherein the antenna node comprises at least one of a dodecahedral antenna node comprising twelve antenna coils and a gradient antenna node comprising two or more antenna coils.

22. The system of claim 11, further comprising one or more rangefinder devices, associated with the magnetic field sensing locating device, to measure above ground relative distance between at least one reference object and the buried utility, wherein the distance information obtained from the one or more rangefinder devices is utilized to align the buried utility and traced location of the buried utility on a geographical map of the multi-utility region.

23. The system of claim 11, further comprising a mark reader device, associated with the magnetic field sensing locating device, to detect and read a pre-existing electronic mark associated with the buried utility, wherein information obtained from reading the pre-existing electronic mark is utilized to trace location of the buried utilities.

24. A system for uniquely identifying and mapping buried utilities in a multi-utility region, the system comprising:
- one or more magnetic field sensing locating devices including one or more of vehicle-mounted magnetic field sensing locating devices and/or hand-carried magnetic field sensing locating devices, each of the plurality of magnetic field sensing locating devices comprising:
  - two or more antenna nodes each including two or more nested orthogonal antenna coils for sensing AC (alternating current) magnetic fields emitted from a plurality of buried utilities and providing antenna output signals corresponding to the sensed magnetic fields;
  - a receiver circuit to receive and process antenna node output signals to provide receiver output signals corresponding to the received magnetic field signals; and
  - a processing unit coupled to the receiver output to receive the receiver output signals, and to a location identification module to process the receiver output signals, and identify utility data pertaining to the plurality of buried utilities from the receiver output signals, wherein the utility data comprises a plurality of location data points each indicative of location information pertaining to at least one of the buried utilities, and associated characteristics of the at least one of the buried utilities; and
- a remote server communicatively coupled to the one or more magnetic field sensing locating devices, the remote server comprising a utility classification module to receive the location data points identified by the plurality of magnetic field sensing locating devices, generate a plurality of clusters each including a set of location data points sharing common characteristics, identify one or more patterns exhibited by each of the clusters, and classify the clusters based on the patterns to uniquely identify and locate each of the buried utilities.

25. The system of claim 24, further comprising one or more positioning devices operably coupled to the one or more magnetic field sensing locating devices to convert the location information indicated by the location data points into an absolute position capable of being represented according to a universal coordinate system.

26. The system of claim 24, wherein the location data points are associated with timestamps based on which the location data points in the clusters are correlated with each other to trace location of the uniquely identified buried utilities.

27. The system of claim 26, wherein each of the uniquely identified buried utilities and corresponding traced locations is mapped on a geographical map of the multi-utility region for display on one or more user electronic devices coupled to corresponding one or more of magnetic field sensing locating devices.

* * * * *